United States Patent
Baek et al.

(10) Patent No.: US 10,811,430 B2
(45) Date of Patent: Oct. 20, 2020

(54) THREE-DIMENSIONAL SEMICONDUCTOR MEMORY DEVICES

(71) Applicant: Samsung Electronics Co., Ltd., Suwon-si, Gyeonggi-do (KR)

(72) Inventors: Seokcheon Baek, Hwaseong-si (KR); Kwang-Soo Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/272,288

(22) Filed: Feb. 11, 2019

(65) Prior Publication Data
US 2019/0393241 A1    Dec. 26, 2019

(30) Foreign Application Priority Data

Jun. 22, 2018  (KR) .......................... 10-2018-0072054

(51) Int. Cl.
| | |
|---|---|
| *H01L 27/11582* | (2017.01) |
| *H01L 27/11565* | (2017.01) |
| *H01L 27/1157* | (2017.01) |
| *H01L 27/11573* | (2017.01) |
| *H01L 29/423* | (2006.01) |
| *H01L 23/522* | (2006.01) |
| *H01L 23/528* | (2006.01) |
| *H01L 27/11556* | (2017.01) |
| *H01L 21/768* | (2006.01) |
| *H01L 21/28* | (2006.01) |

(52) U.S. Cl.
CPC .. *H01L 27/11582* (2013.01); *H01L 21/76897* (2013.01); *H01L 23/5226* (2013.01); *H01L 23/5283* (2013.01); *H01L 27/1157* (2013.01); *H01L 27/11565* (2013.01); *H01L 27/11573* (2013.01); *H01L 29/40117* (2019.08); *H01L 29/4234* (2013.01); *H01L 27/11556* (2013.01)

(58) Field of Classification Search
CPC ..................... H01L 27/11556; H01L 27/11582
See application file for complete search history.

(56) References Cited

U.S. PATENT DOCUMENTS

| | | | |
|---|---|---|---|
| 8,325,527 | B2 | 12/2012 | Jin et al. |
| 9,196,525 | B2 | 11/2015 | Shim et al. |
| 9,543,317 | B2 | 1/2017 | Kim |
| (Continued) | | | |

FOREIGN PATENT DOCUMENTS

| | | |
|---|---|---|
| KR | 101434588 | 8/2014 |
| KR | 1020170046892 | 5/2017 |

*Primary Examiner* — Daniel P Shook
(74) *Attorney, Agent, or Firm* — Myers Bigel, P.A.

(57) ABSTRACT

Three-dimensional semiconductor memory devices are provided. The devices may include a semiconductor layer and electrode structures on the semiconductor layer. The electrode structures may include a first electrode structure including a first electrode portion and a first pad portion and a second electrode structure including a second electrode portion and a second pad portion. Each of the first and second electrode portions has a first width, each of the first and second pad portions has a second width, and the second width may be less than the first width. The first and second electrode portions may be spaced apart from each other by a first distance, and the first and second pad portions may be spaced apart from each other by a second distance that may be greater than the first distance.

20 Claims, 28 Drawing Sheets

(56) References Cited

U.S. PATENT DOCUMENTS

| | | |
|---|---|---|
| 9,634,016 B2 | 4/2017 | Kim et al. |
| 9,865,540 B2 | 1/2018 | Kim et al. |
| 2016/0133644 A1 | 5/2016 | Lee |
| 2017/0207221 A1* | 7/2017 | Kim .................... H01L 27/1052 |
| 2017/0236746 A1 | 8/2017 | Yu et al. |
| 2017/0287833 A1 | 10/2017 | Thimmegowda et al. |

* cited by examiner

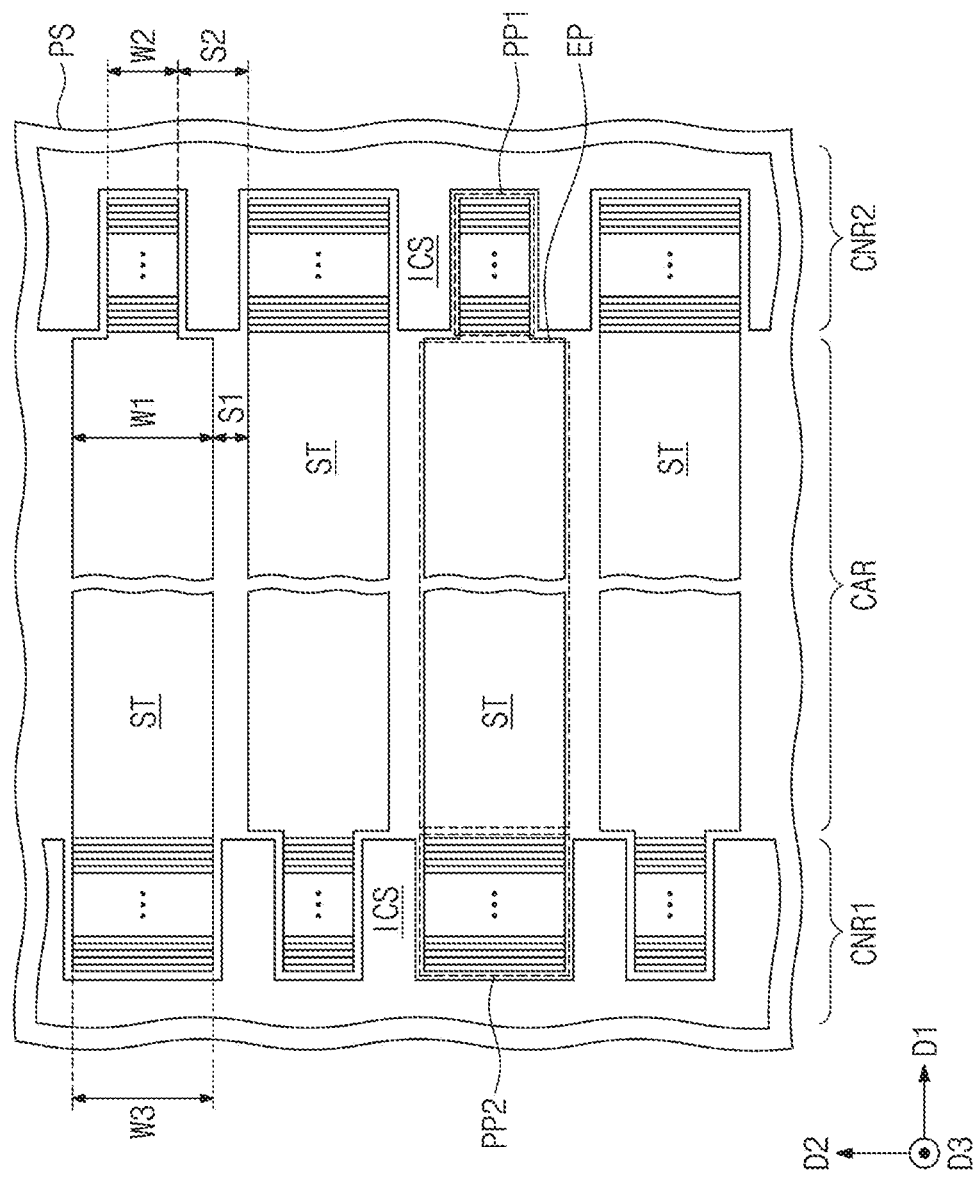

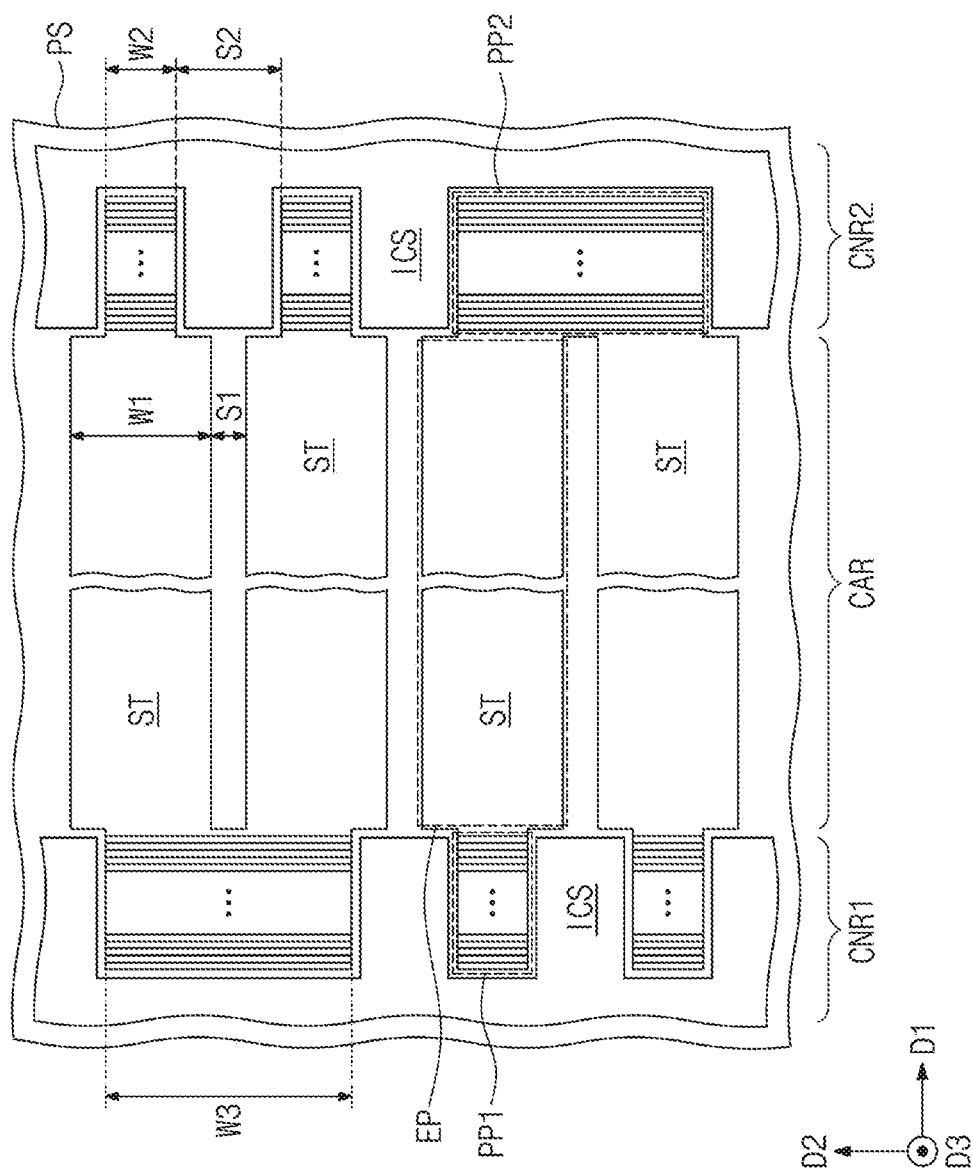

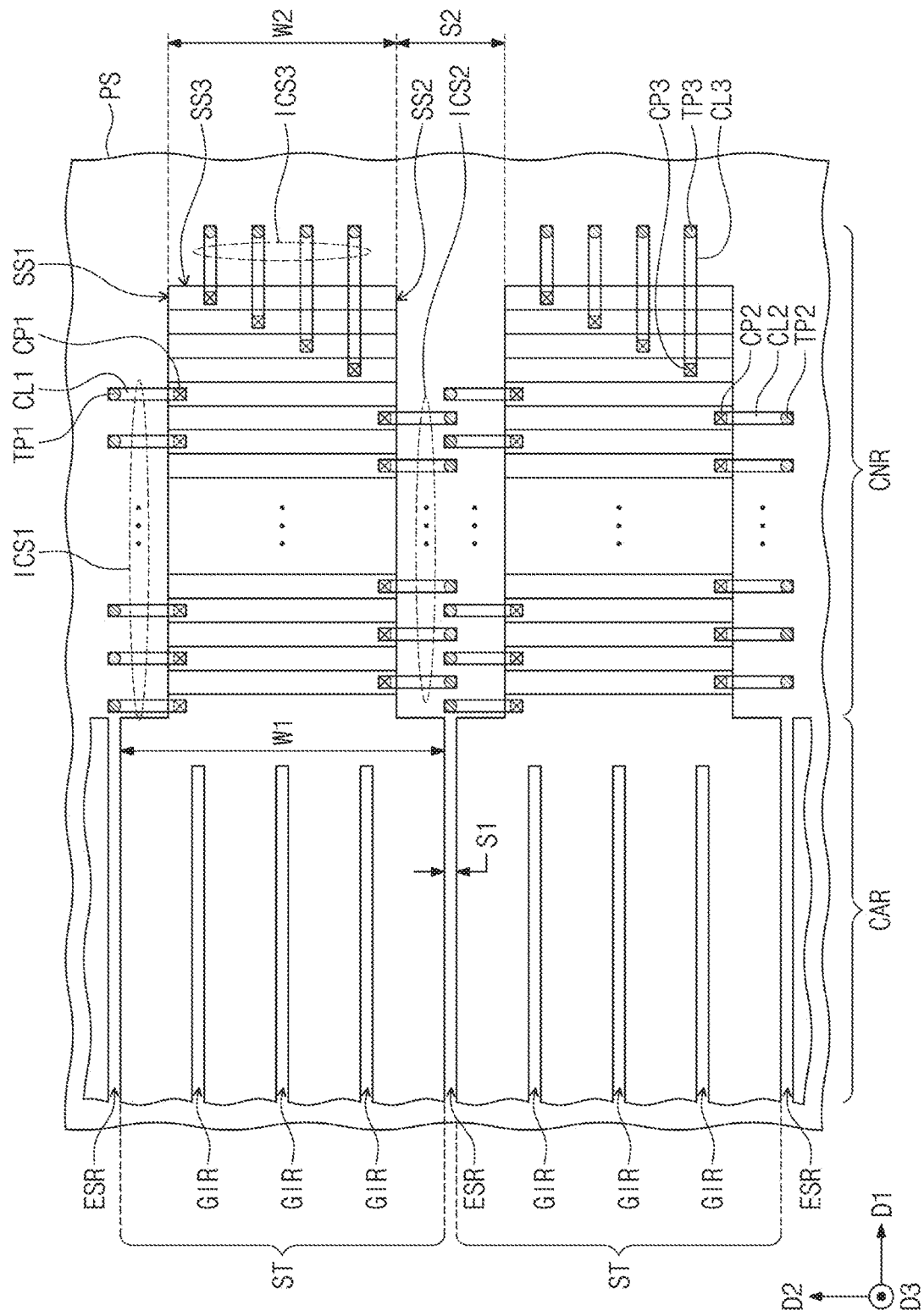

THREE-DIMENSIONAL SEMICONDUCTOR MEMORY DEVICES

CROSS-REFERENCE TO RELATED APPLICATION

This U.S. non-provisional application claims priority under 35 U.S.C. § 119 to Korean Patent Application No. 10-2018-0072054 filed on Jun. 22, 2018 in the Korean Intellectual Property Office, the disclosure of which is incorporated herein in its entirety by reference.

BACKGROUND

The present disclosure relates to memory devices, and more particularly, to three-dimensional semiconductor memory devices.

Semiconductor devices have been highly integrated for high performance and low manufacturing cost. Because integration density of the semiconductor devices may be one of the major factors in determining price, increasing integration density may be beneficial. Integration density of two-dimensional or planar semiconductor memory devices may heavily depend on the area occupied by a unit memory cell, such that integration density may be influenced by the level of technology for forming fine patterns. Expensive equipment may be used to form fine patterns, and thus three-dimensional semiconductor memory devices have been developed to overcome limitations of two-dimensional semiconductor memory devices.

SUMMARY

Some example embodiments of the present inventive concepts provide three-dimensional semiconductor memory devices with enhanced reliability and high integration density.

An object of the present inventive concepts is not limited to the mentioned above, and other objects which have not been mentioned above will be clearly understood to those skilled in the art from the following description.

According to some example embodiments of the present inventive concepts, three-dimensional semiconductor memory devices may include a semiconductor layer including a cell array region and a connection region and a plurality of electrode structures on a surface of the semiconductor layer. The plurality of electrode structures may each extend in a first direction and may be spaced apart from each other in a second direction intersecting the first direction, and both the first direction and the second direction may be parallel to the surface of the semiconductor layer. The plurality of electrode structures may include a first electrode structure including a first electrode portion having a first width in the second direction on the cell array region and a first pad portion having a second width in the second direction on the connection region and a second electrode structure including a second electrode portion having the first width in the second direction on the cell array region and a second pad portion having the second width in the second direction on the connection region. The second width may be less than the first width. The first electrode structure and the second electrode structure may be directly adjacent each other. The first electrode portion and the second electrode portion may be spaced apart from each other by a first distance, and the first pad portion and the second pad portion may be spaced apart from each other by a second distance that may be greater than the first distance.

According to some example embodiments of the present inventive concepts, three-dimensional semiconductor memory devices may include a horizontal semiconductor layer including a cell array region and a connection region and an electrode structure that includes a plurality of electrodes vertically stacked on a surface of the horizontal semiconductor layer and has a stair-step structure on the connection region. The electrode structure may include a first side surface and a second side surface that each extend in a first direction and are spaced apart from each other in a second direction intersecting the first direction, and the electrode structure may further include a third side surface that connects the first and second side surfaces to each other. The devices may also include a first interconnection structure that is adjacent to the first side surface of the electrode structure on the connection region, a second interconnection structure that is adjacent to the second side surface of the electrode structure on the connection region, and a third interconnection structure that is adjacent to the third side surface of the electrode structure. The first interconnection structure may include a plurality of first conductive lines that each extend in the second direction. The second interconnection structure may include a plurality of second conductive lines that are spaced apart from the plurality of first conductive lines and each extend in the second direction. The third interconnection structure may include a plurality of third conductive lines that each extend in the first direction.

According to some example embodiments of the present inventive concepts, three-dimensional semiconductor memory devices may include a horizontal semiconductor layer including a cell array region and a connection region and an electrode structure that may include a plurality of electrodes vertically stacked on the horizontal semiconductor layer. The electrode structure may extend in a first direction and may include a stair-step structure on the connection region. The device may also include an interconnection structure on the connection region. The interconnection structure may include a plurality of first contact plugs that are connected to first ones of the plurality of electrodes, respectively, a plurality of first conductive lines that extend in the first direction and are connected to the plurality of first contact plugs, respectively, a plurality of second contact plugs that are connected to second ones of the plurality of electrodes, respectively, and a plurality of second conductive lines that extend in a second direction intersecting the first direction and are connected to the plurality of second contact plugs, respectively.

Details of example embodiments are included in the description and drawings.

BRIEF DESCRIPTION OF THE DRAWINGS

FIGS. 4A to 4E illustrate simplified plan views showing a cell array structure of a three-dimensional semiconductor memory device according to some example embodiments of the present inventive concepts.

FIGS. 12A, 12B, 12C, and 12D illustrate plan views showing a three-dimensional semiconductor memory device according to some example embodiments of the present inventive concepts.

DETAILED DESCRIPTION

Some example embodiments of the present inventive concepts will be described below in detail in conjunction with the accompanying drawings.

Figure 1:
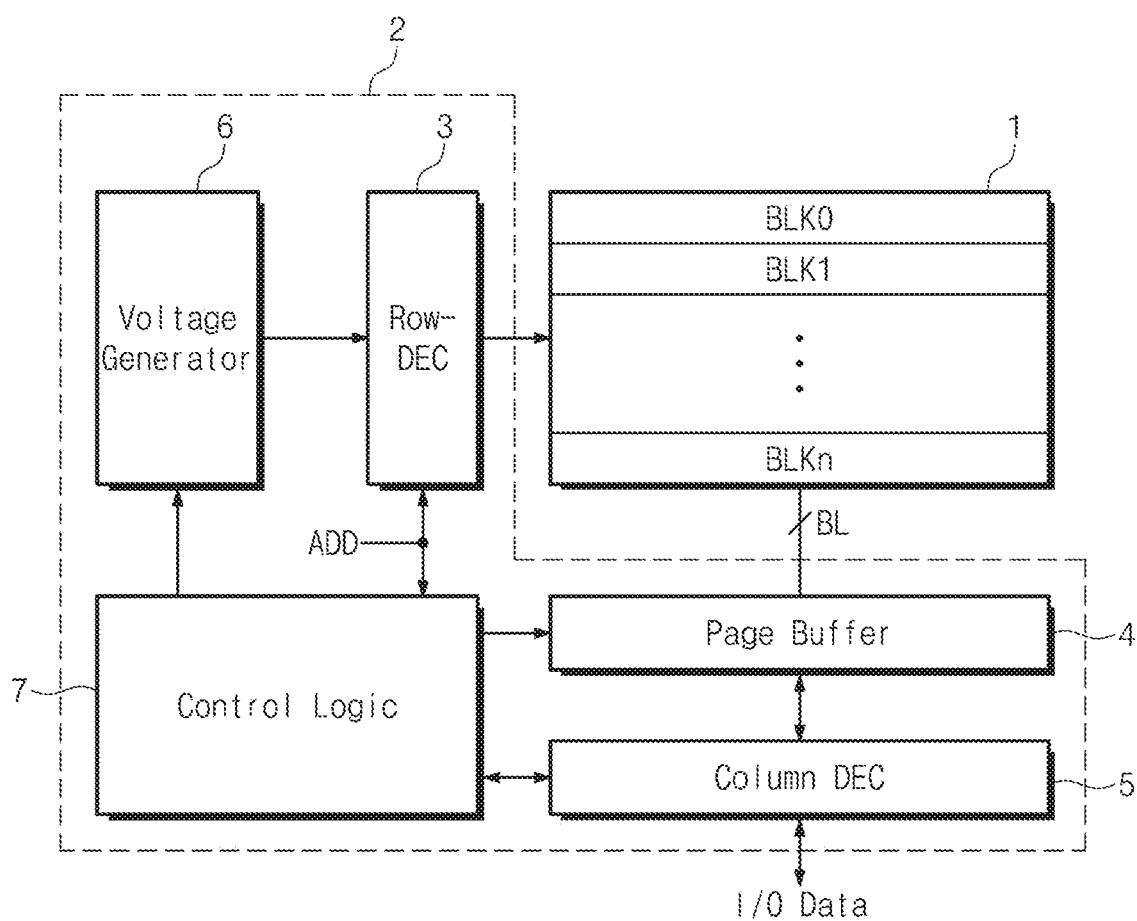
FIG. 1 illustrates a schematic diagram showing a simplified configuration of a three-dimensional semiconductor memory device according to some example embodiments of the present inventive concepts.

FIG. 1 illustrates a schematic diagram showing a simplified configuration of a three-dimensional semiconductor memory device according to some example embodiments of the present inventive concepts.

Referring to FIG. 1, a three-dimensional semiconductor memory device may include a memory cell array 1 and a peripheral circuit 2 that controls the memory cell array 1. The peripheral circuit 2 may include a row decoder 3, a page buffer 4, a column decoder 5, a voltage generator 6, and a control circuit 7.

The memory cell array 1 may include a plurality of memory blocks BLK0 to BLKn, each of which memory blocks BLK0 to BLKn may include a plurality of three-dimensionally arranged memory cells. In some example embodiments, the memory blocks BLK0 to BLKn may include a plurality of NAND type cell strings. The memory blocks BLK0 to BLKn may be connected to the row decoder 3 through word lines and select lines.

The row decoder 3 may decode an externally input address ADD to select one of the memory blocks BLK0 to BLKn and may then select one of word lines included in the selected one of the memory blocks BLK0 to BLKn. The page buffer 4 may be connected through bit lines BL to the memory cell array 1 and may read information stored in the memory cells. The column decoder 5 may decode the externally input address ADD and select one of the bit lines BL. The column decoder 5 may provide a data transmission path between the page buffer 4 and an external device (e.g., a memory controller). The voltage generator 6 may generate voltages (e.g., program voltage, read voltage, and erase voltage) required for internal operation of the memory cell array 1.

Figure 2:
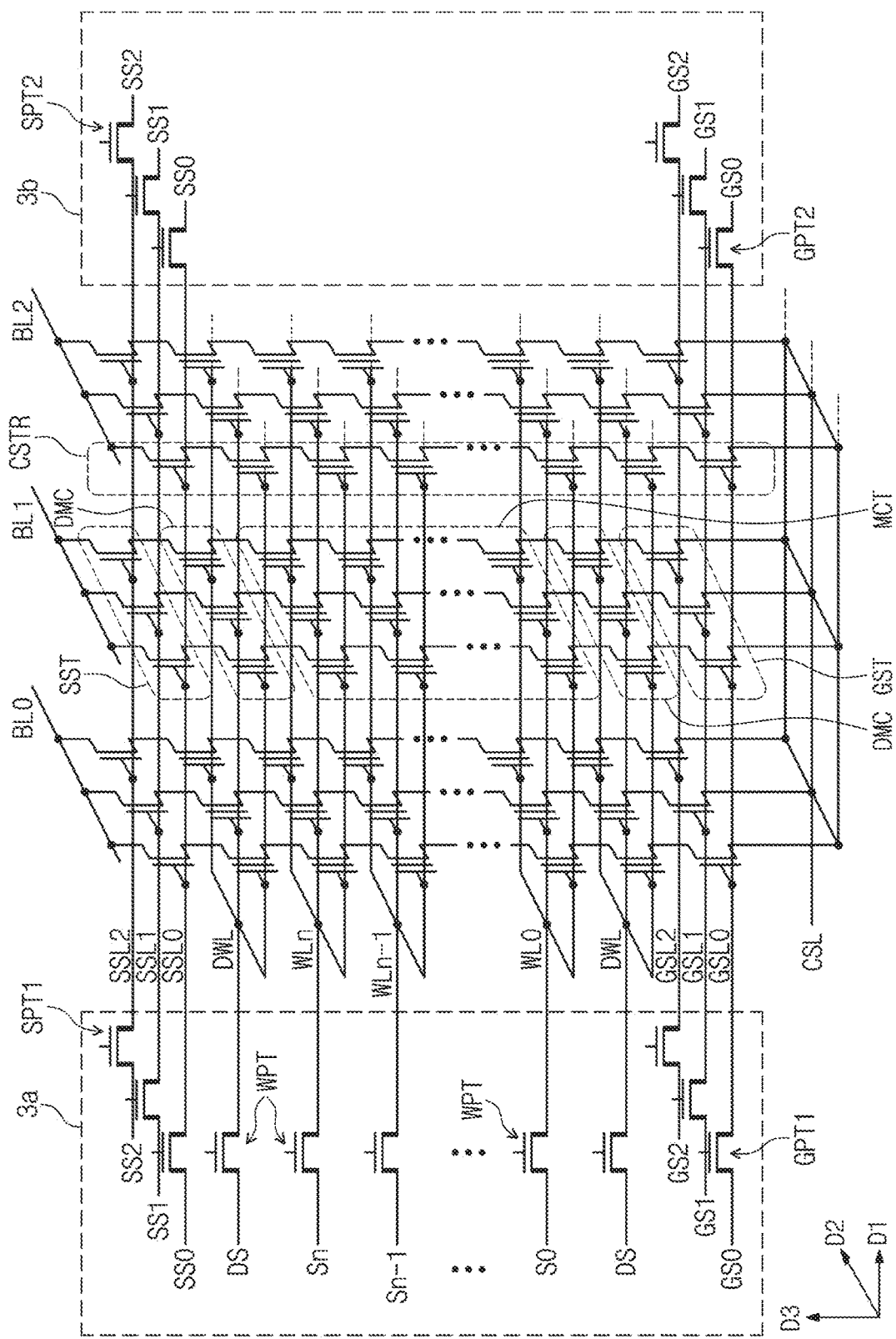
FIG. 2 illustrates a simplified circuit diagram showing a three-dimensional semiconductor memory device according to some example embodiments of the present inventive concepts.

FIG. 2 illustrates a simplified circuit diagram showing a three-dimensional semiconductor memory device according to some example embodiments of the present inventive concepts.

Referring to FIG. 2, a three-dimensional semiconductor memory device according to some example embodiments may include memory blocks (see BLK0 to BLKn of FIG. 1), and each of the memory blocks may include a common source line CSL, a plurality of bit lines BL0 to BL2, and a plurality of cell strings CSTR between the common source line CSL and the bit lines BL0 to BL2.

The cell strings CSTR may extend in a third direction D3 on a plane elongated along first and second directions D1 and D2. The bit lines BL0 to BL2 may be spaced apart from each other in the first direction D1 and may extend in (e.g., extend longitudinally in) the second direction D2.

A plurality of cell strings CSTR may be connected in parallel to each of the bit lines BL0 to BL2. The plurality of cell strings CSTR may be connected in common to the common source line CSL. For example, the plurality of cell strings CSTR may be disposed between a plurality of bit lines BL0 to BL2 and one common source line CSL. The common source line CSL may be provided in plural arranged two-dimensionally. The plurality of common source lines CSL may be supplied with the same voltage or electrically controlled independently of each other.

In some example embodiments, each of the cell strings CSTR may include a string select transistor SST, memory cell transistors MCT connected in series, and a ground select transistor GST. Each of the memory cell transistors MCT may include a data storage element. In each of the cell strings CSTR, the string select transistor SST may be coupled to (e.g., be electrically connected to) one of the bit lines BL0 to BL2, and the ground select transistor GST may be coupled to (e.g., be electrically connected to) the common source line CSL. The memory cell transistors MCT may be connected in series between the string select transistor SST and the ground select transistor GST. Each of the cell strings CSTR may further include dummy cell transistors DMC between the string select transistor SST and the memory cell transistor MCT and between the ground select transistor GST and the memory cell transistor MCT.

In some example embodiments, the string select transistor SST may be controlled by one of string select lines SSL0 to SSL2, the memory cell transistors MCT may be controlled by a plurality of word lines WL0 to WLn, and the dummy cell transistors DMC may be controlled by dummy word lines DWL. The ground select transistor GST may be controlled by a corresponding one of ground select lines GSL0 to GLS2. The common source line CSL may be connected in common to sources of the ground select transistors GST.

The memory cell transistors MCT may include gate electrodes, which are located at substantially the same distance from the common source lines CSL, connected in common to one of the word lines WL0 to WLn and DWL, which may result that the gate electrodes may have an equipotential state. The ground select lines GSL0 to GSL2 and the string select lines SSL0 to SSL2 may extend along the first direction D1 and may be spaced apart from each other in the second direction D2. The ground select lines GSL0 to GSL2, which are located at substantially the same level from the common source lines CSL, may be electrically separated from each other, and the same may be true of the string select lines SSL0 to SSL2.

Row decoders 3a and 3b may include a plurality of pass transistors SPT1, SPT2, WPT, GPT1, and GPT2 that are correspondingly connected to the word lines WL0 to WLn and DWL and the select lines SSL0 to SSL2 and GSL0 to GSL2. The pass transistors SPT1, SPT2, WPT, GPT1, and GPT2 may provide drive signals GS0 to GS2, SS0 to SS2, DS, and S0 to Sn to the word lines WL0 to WLn and DWL and the select lines SSL0 to SSL2 and GSL0 to GLS2 included in a selected one of the memory blocks (see BLK0 to BLKn of FIG. 1). In some example embodiments, the word lines WL0 to WLn may be provided with a program voltage, a read voltage, a pass voltage, or a verify voltage, and the select lines SSL0 to SSL2 and GSL0 to GSL2 may be provided with a ground voltage, a power voltage, or a threshold voltage.

Figure 3:
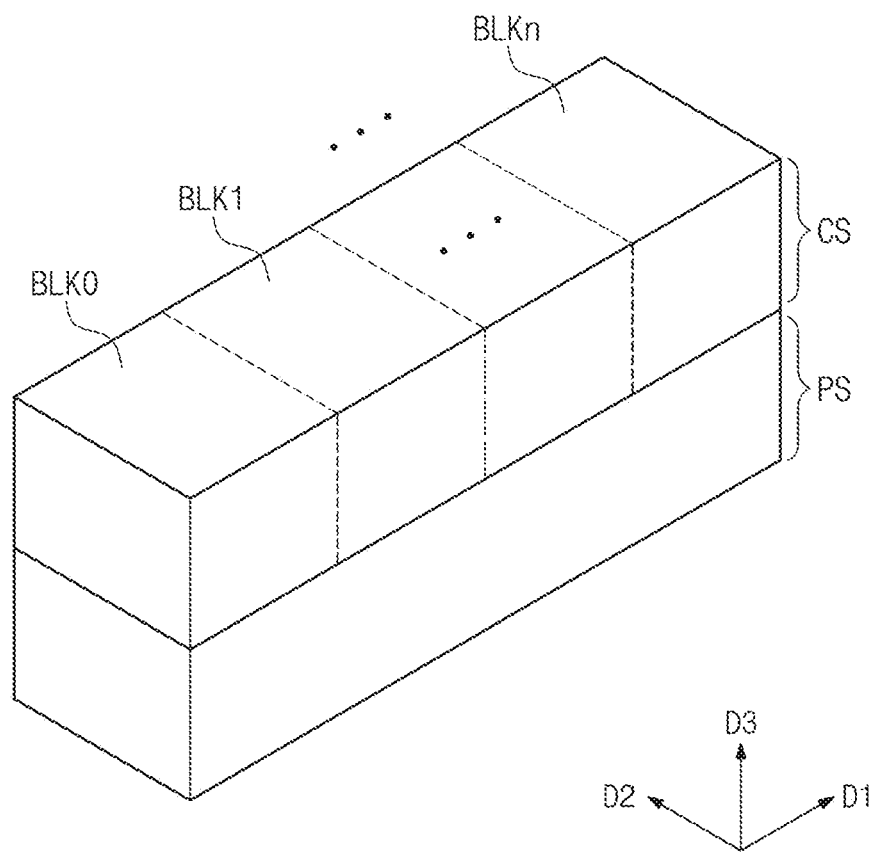
FIG. 3 illustrates a simplified perspective view showing a three-dimensional semiconductor memory device according to some example embodiments of the present inventive concepts.

FIG. 3 illustrates a simplified perspective view showing a three-dimensional semiconductor memory device according to some example embodiments of the present inventive concepts.

Referring to FIG. 3, a three-dimensional semiconductor memory device according to some example embodiments may include a peripheral circuit structure PS, a cell array structure CS on the peripheral circuit structure PS, and an interconnection structure that connects the cell array structure CS to the peripheral circuit structure PS.

The peripheral circuit structure PS may include row and column decoders, a page buffer, and control circuits, as discussed with reference to FIG. 1.

When viewed in plan, the cell array structure CS may overlap the peripheral circuit structure PS. The cell array structure CS may include a plurality of memory blocks BLK0 to BLKn as data erase units. Each of the memory blocks BLK0 to BLKn may include a memory cell array having a three-dimensional structure (or a vertical structure), as discussed with reference to FIG. 2.

FIGS. 4A to 4E illustrate simplified plan views showing a cell array structure of a three-dimensional semiconductor memory device according to some example embodiments of the present inventive concepts.

Figure 6:
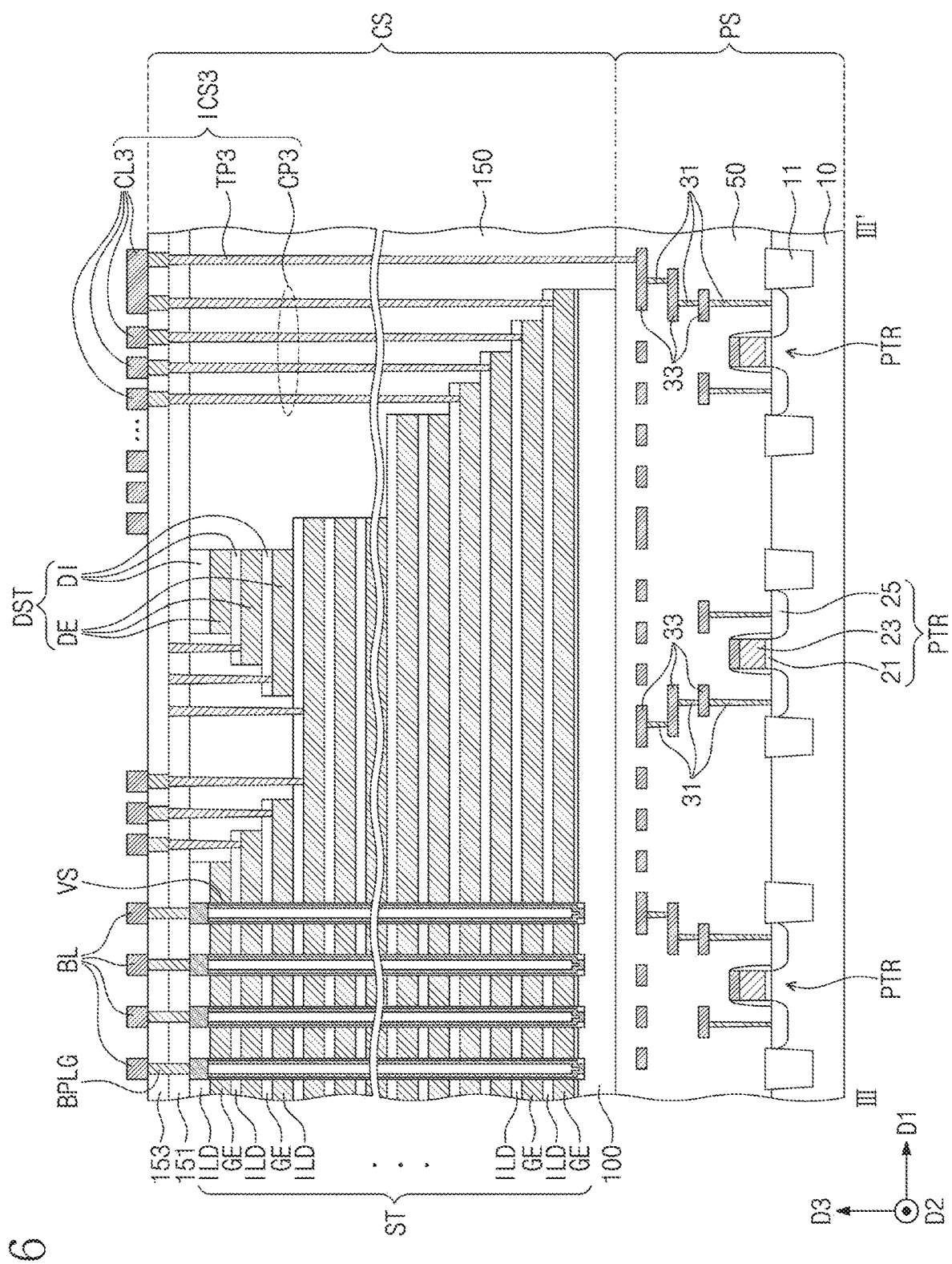
FIG. 6 illustrates a cross-sectional view taken along a first direction, showing the three-dimensional semiconductor memory device of FIG. 5.

Referring to FIGS. 4A to 4E, a three-dimensional semiconductor memory device according to some example embodiments may include a plurality of memory blocks (see BLK0 to BLKn of FIG. 3) disposed on a horizontal semiconductor layer (see 100 of FIG. 6).

The horizontal semiconductor layer 100 may include a cell array region CAR, a first connection region CNR1 on one side of the cell array region CAR, and a second connection region CNR2 on other side of the cell array region CAR. The first and second connection regions CNR1 and CNR2 may be spaced apart in a first direction D1 from each other across the cell array region CAR.

Each of the memory blocks (see BLK0 to BLKn of FIG. 3) may include an electrode structure ST having a plurality of electrodes that are vertically stacked on the horizontal semiconductor layer 100, and also include interconnection structures ICS that connect the electrode structure ST to peripheral logic circuits.

A plurality of electrode structures ST may extend in (e.g., extend longitudinally in) the first direction D1 on the horizontal semiconductor layer 100, and may be spaced apart from each other in a second direction D2 intersecting the first direction D1.

The electrodes in each electrode structure ST may extend in (e.g., extend longitudinally in) the first direction D1 and may be stacked to form a stair-step structure on each of the first and second connection regions CNR1 and CNR2. Therefore, the electrode structure ST may have a height that decreases with increasing distance from the cell array region CAR.

Each of the electrode structures ST may include an electrode portion EP that is provided on the cell array region CAR and has a first width W1 and also include pad portions PP that are provided on the first and second connection regions CNR1 and CNR2 and each have a second width W2 less than the first width W1. The pad portions PP may have the stair-step structures defined by the electrodes. In some embodiments, the first width W1 is a width of the electrode portion EP in the second direction D2, and the second width W2 is a width of the pad portion PP in the second direction D2, as illustrated in FIG. 4A.

Figure 4A:
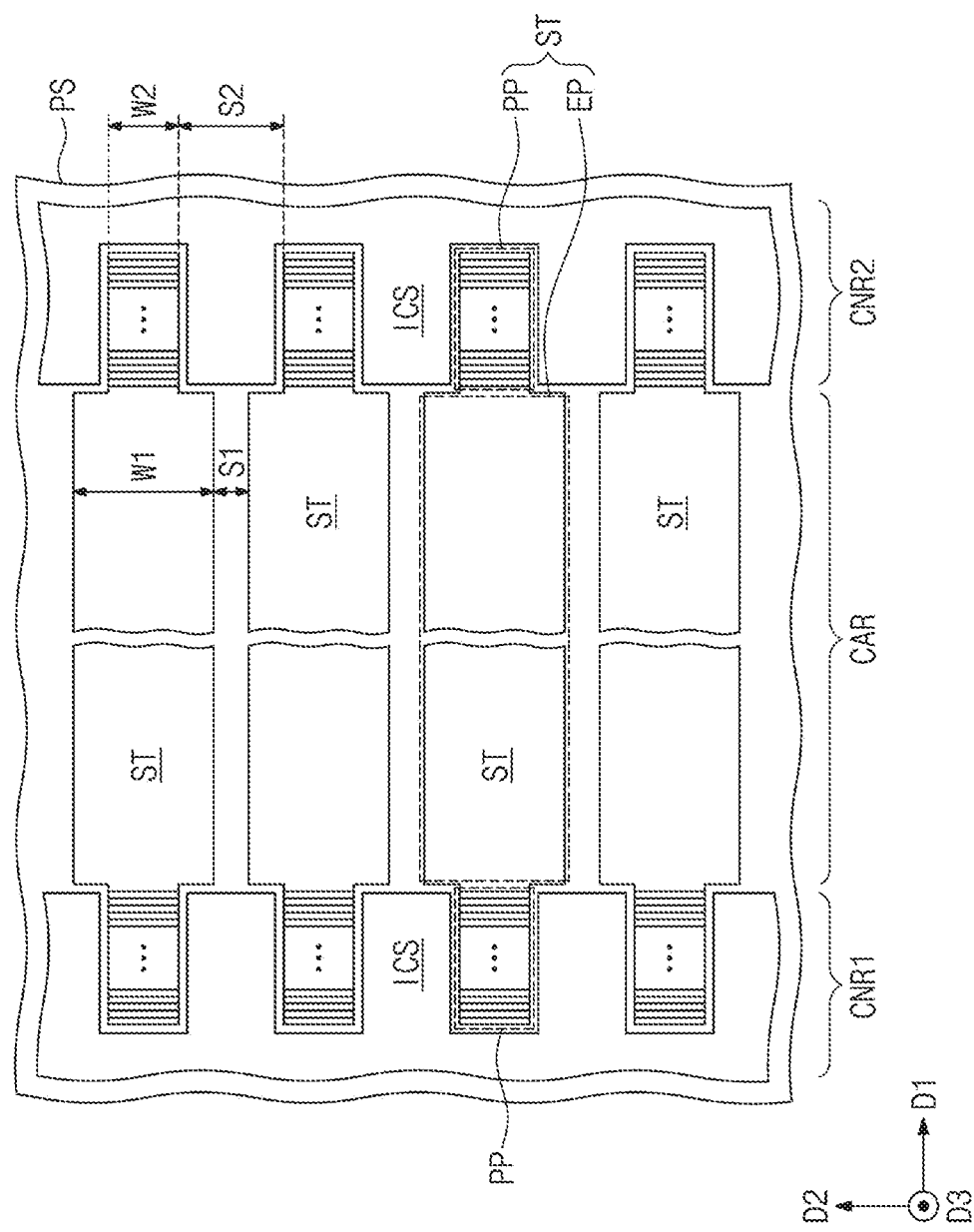

In some example embodiments, the electrode portions EP of the electrode structures ST directly adjacent to each other in the second direction D2 may be spaced apart from each other by a first distance S1, and the pad portions PP of the electrode structures ST directly adjacent to each other in the second direction D2 may be spaced apart from each other by a second distance S2 that is greater than the first distance S1, as illustrated in FIG. 4A. In such cases, the electrode structures ST may have a greater spacing therebetween on the first or second connection region CNR1 or CNR2 than on the cell array region CAR. It will be understood that the term "directly adjacent" as used herein includes configurations where two elements, which are said to be directly adjacent to one another, are positioned so that no other like element is located between these two elements. For example, "two electrode structures ST directly adjacent each other" may refer to two electrode structures ST between which no intervening electrode structure ST is provided.

The interconnection structures ICS may be disposed on the first and second connection regions CNR1 and CNR2. In some example embodiments, on the first and second connection regions CNR1 and CNR2, the interconnection structures ICS may be provided on locations other than those occupied by the electrode structures ST. The interconnection structures ICS may include contact plugs and conductive lines that are connected to the electrodes of the electrode structure ST and to the peripheral logic circuits. When viewed in plan, the interconnection structure ICS may be disposed adjacent in the first and second directions D1 and D2 to the pad portion PP of the electrode structure ST. In some embodiments, a portion of the interconnection structure ICS may be provided between the pad portions PP directly adjacent to each other in the second direction D2, as illustrated in FIG. 4A.

Still referring to FIG. 4A, each of the electrode structures ST may include the pad portion PP on each of the first and second connection regions CNR1 and CNR2. On the first and second connection regions CNR1 and CNR2, the pad portions PP of the electrode structure ST may be disposed mirror-symmetrically about an imaginary line parallel to the second direction D2.

Figure 4B:
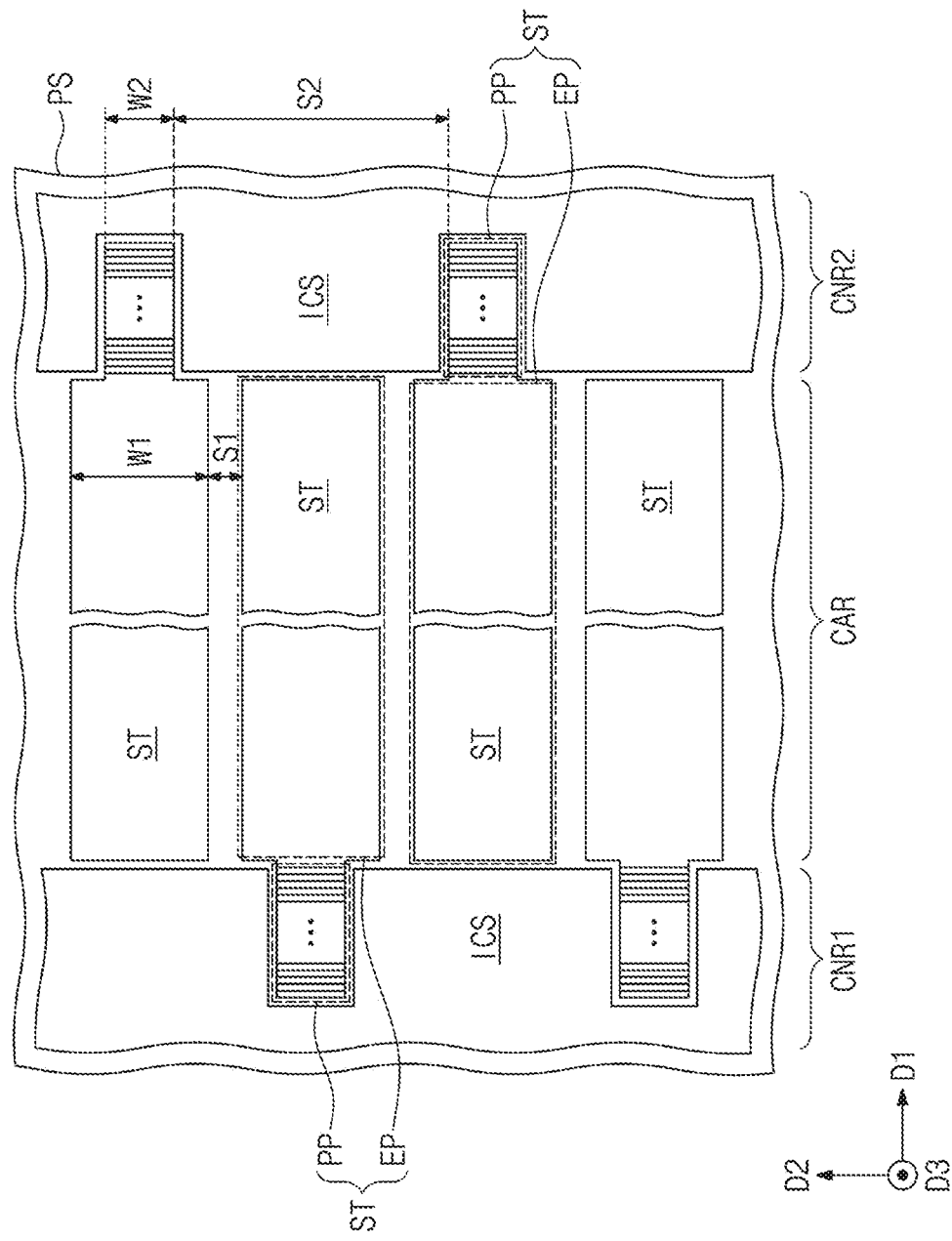

Referring to FIG. 4B, odd-numbered electrode structures ST may include the pad portions PP only on the first connection region CNR1, and even-numbered electrode structures ST may include the pad portions PP only on the second connection region CNR2. The pad portions PP of the electrode structures ST may be disposed staggered with respect to each other on the first and second connection regions CNR1 and CNR2.

Referring to FIG. 4C, each of the electrode structures ST may include the pad portions PP on the first and second connection regions CNR1 and CNR2, and the pad portions PP of each electrode structure ST may have different widths from each other on the first and second connection regions CNR1 and CNR2.

For example, each of the electrode structures ST may include a first pad portion PP1 having a second width W2 less than a first width W1 of the electrode portion EP, and also include a second pad portion PP2 having a third width W3 greater than the second width W2.

In addition, odd-numbered electrode structures ST may include the first pad portion PP1 on the first connection region CNR1 and the second pad portion PP2 on the second connection region CNR2. In contrast, even-numbered electrode structures ST may include the first pad portion PP1 on the second connection region CNR2 and the second pad portion PP2 on the first connection region CNR1. In such cases, on each of the first and second connection regions CNR1 and CNR2, the first and second pad portions PP1 and PP2 may be provided alternately along the second direction D2.

Figure 4D:
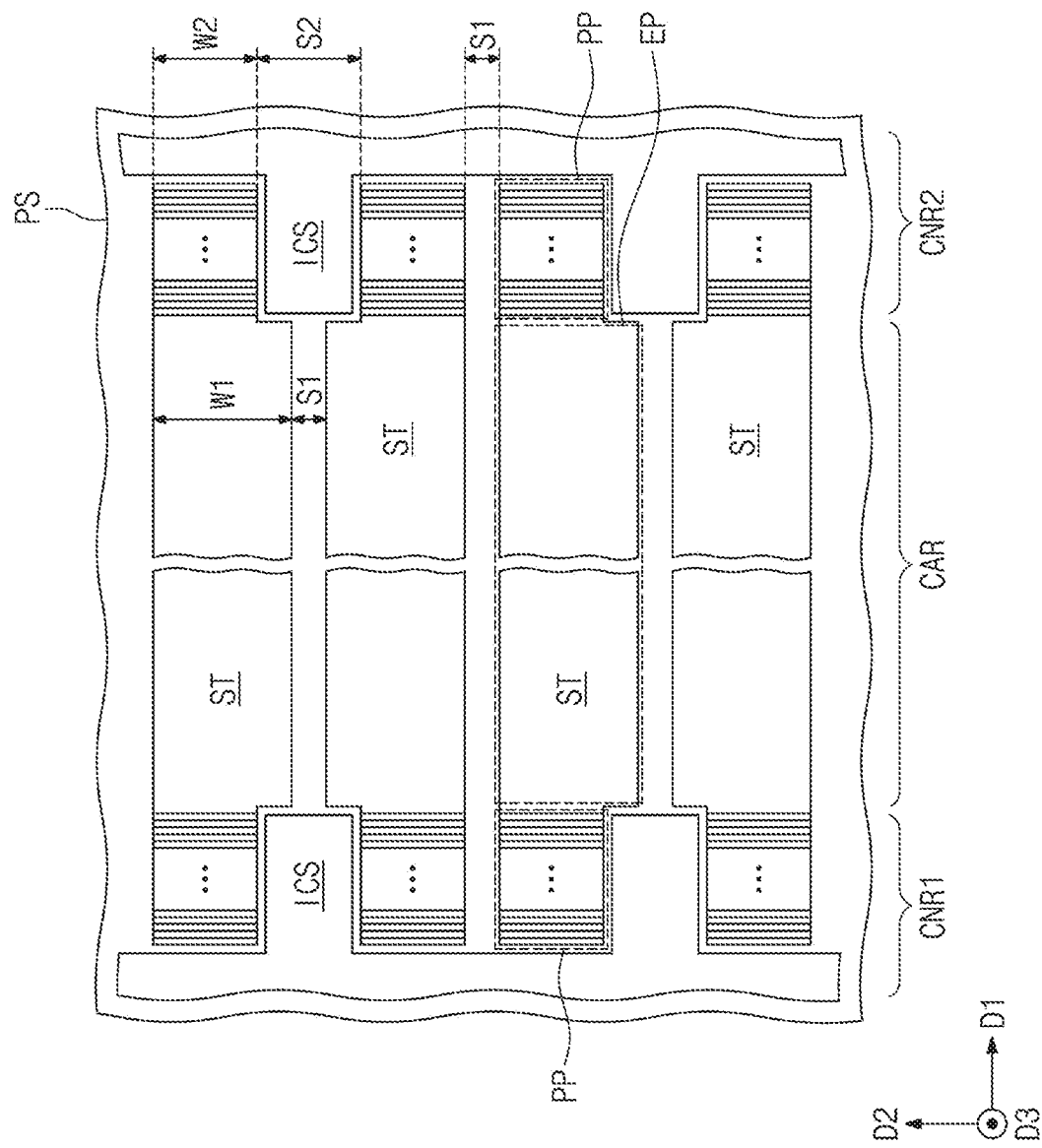

Referring to FIG. 4D, neighboring electrode structures ST may be disposed mirror-symmetrically about an imaginary line that extends in the first direction D1. In such cases, the pad portions PP of the electrode structures ST directly adjacent to each other in the second direction D2 may be spaced apart from each other by a first distance S1 or by a second distance S2 less than the first distance S1.

Referring to FIG. 4E, neighboring electrode structures ST may share a pad portion on one of the first and second connection regions CNR1 and CNR2. For example, each of the electrode structures ST may include a first pad portion PP1 having a second width W2 on the first connection region CNR1, and a pair of electrode structures ST may share a second pad portion PP2 on the second connection region CNR2. The second pad portion PP2 may have a third width W3 greater than a first width W1 of the electrode structure ST on the cell array region CAR.

Figure 5:
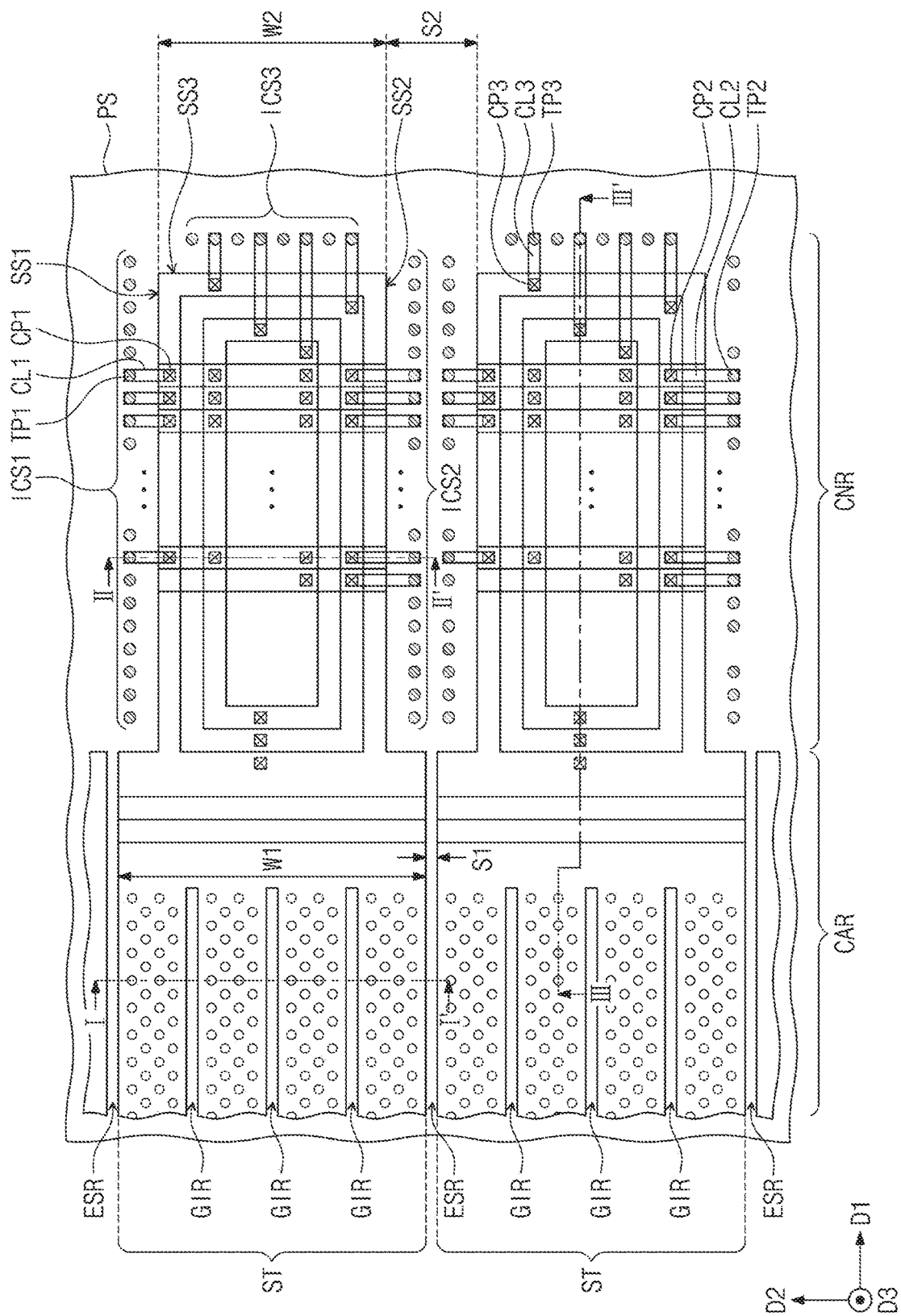
FIG. 5 illustrates a plan view showing a three-dimensional semiconductor memory device according to some example embodiments of the present inventive concepts.
Figure 7:
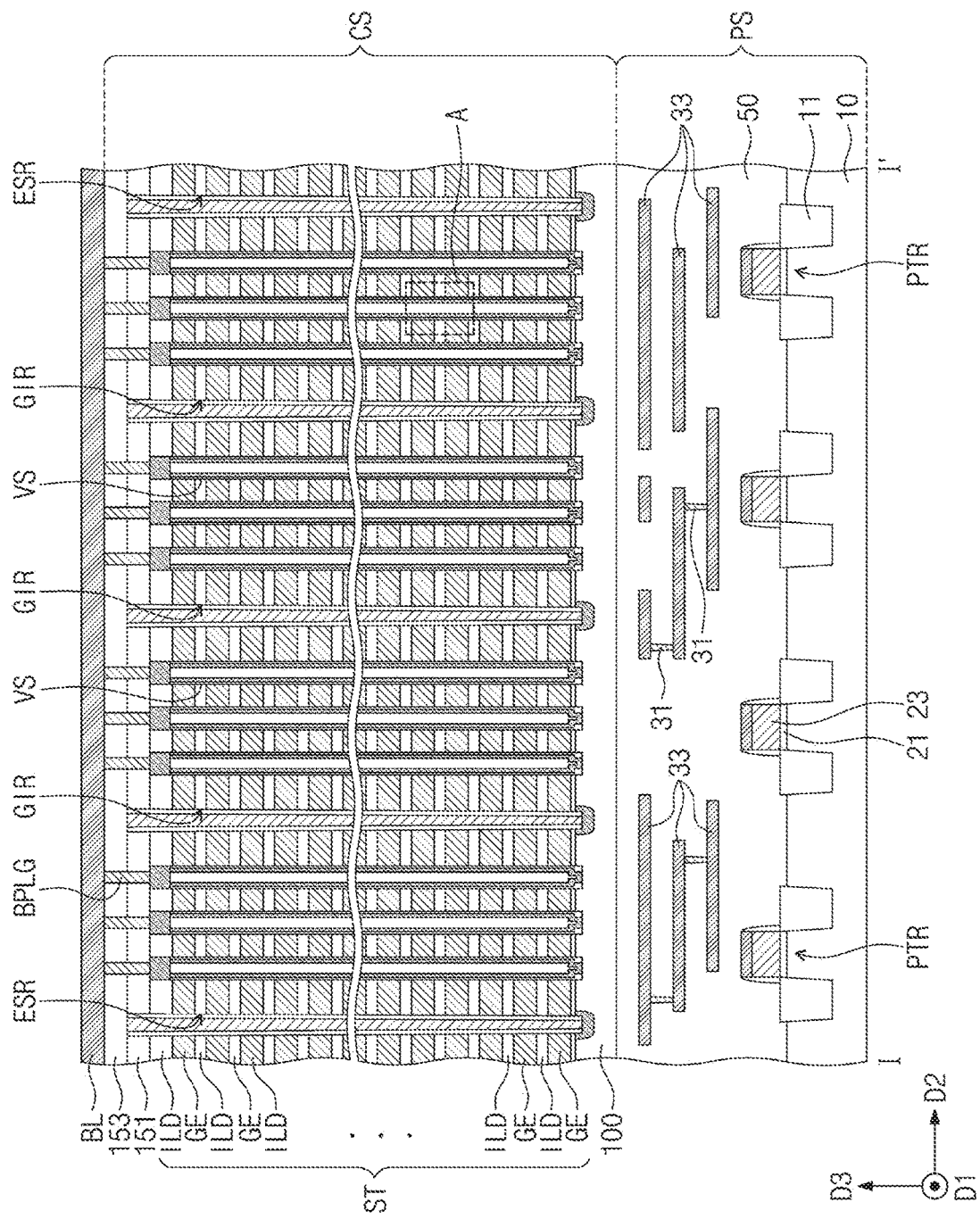
FIG. 7 illustrates a cross-sectional view taken along the line I-I' of FIG. 5, showing the three-dimensional semiconductor memory device of FIG. 5.
Figure 8:
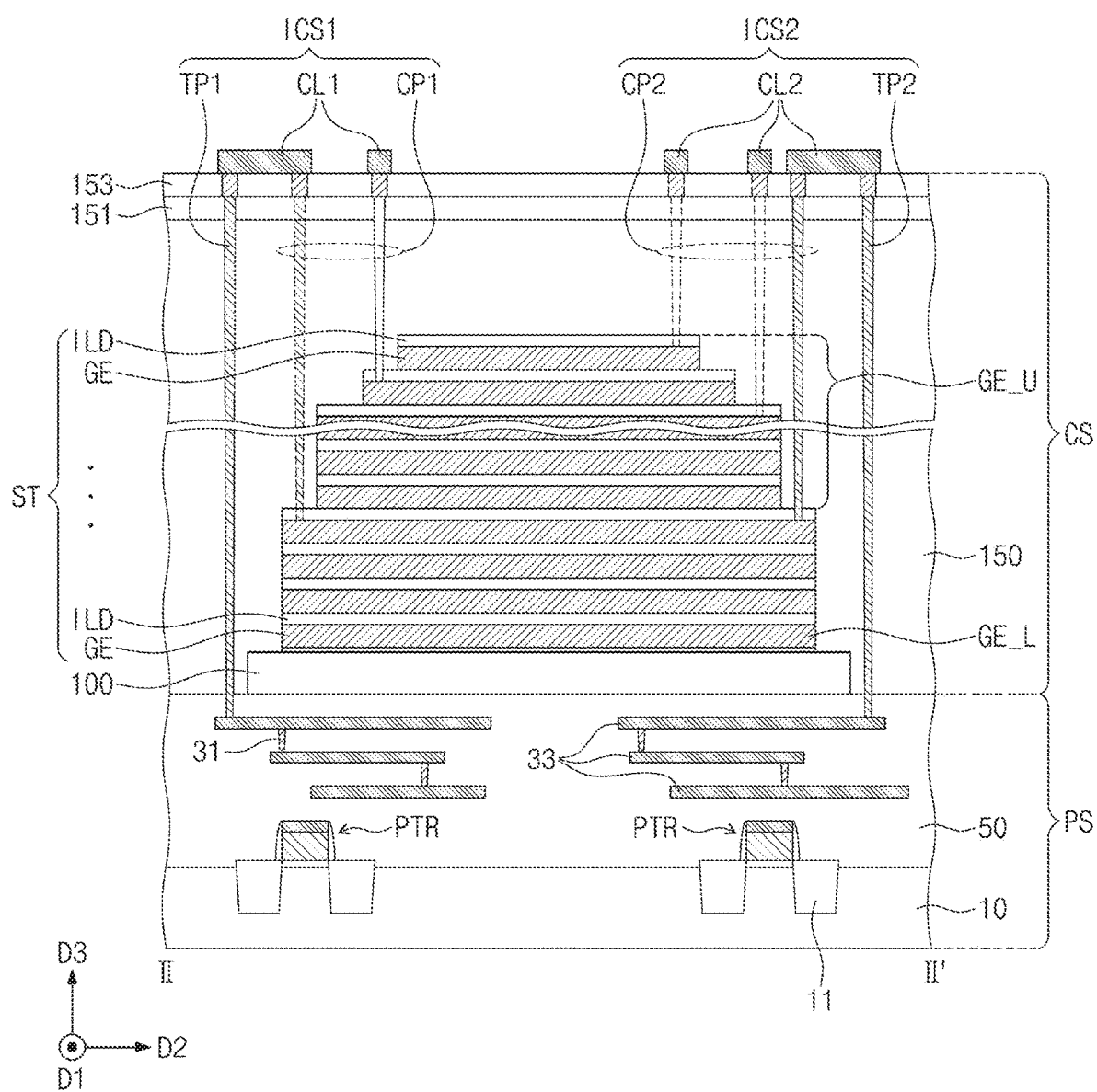
FIG. 8 illustrates a cross-sectional view taken along the line II-IF of FIG. 5, showing the three-dimensional semiconductor memory device of FIG. 5.
Figure 9:
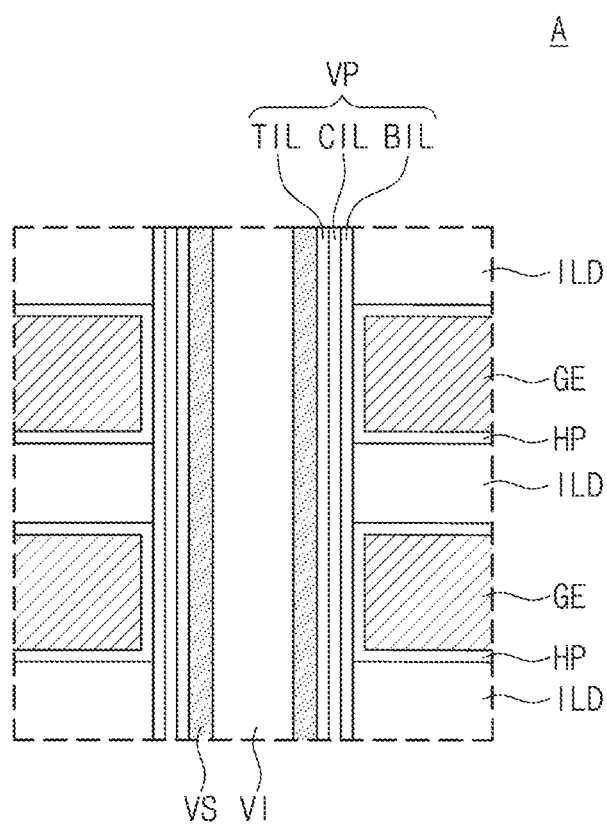
FIG. 9 illustrates an enlarged view showing section A of FIG. 7.

FIG. 5 illustrates a plan view showing a three-dimensional semiconductor memory device according to some example embodiments of the present inventive concepts. FIG. 6 illustrates a cross-sectional view taken along a first direction, showing the three-dimensional semiconductor memory device of FIG. 5. FIG. 7 illustrates a cross-sectional view taken along the line I-I' of FIG. 5, showing the three-dimensional semiconductor memory device of FIG. 5. FIG. 8 illustrates a cross-sectional view taken along the line II-II' of FIG. 5, showing the three-dimensional semiconductor memory device of FIG. 5. FIG. 9 illustrates an enlarged view showing the section A of FIG. 7.

Figure 10:
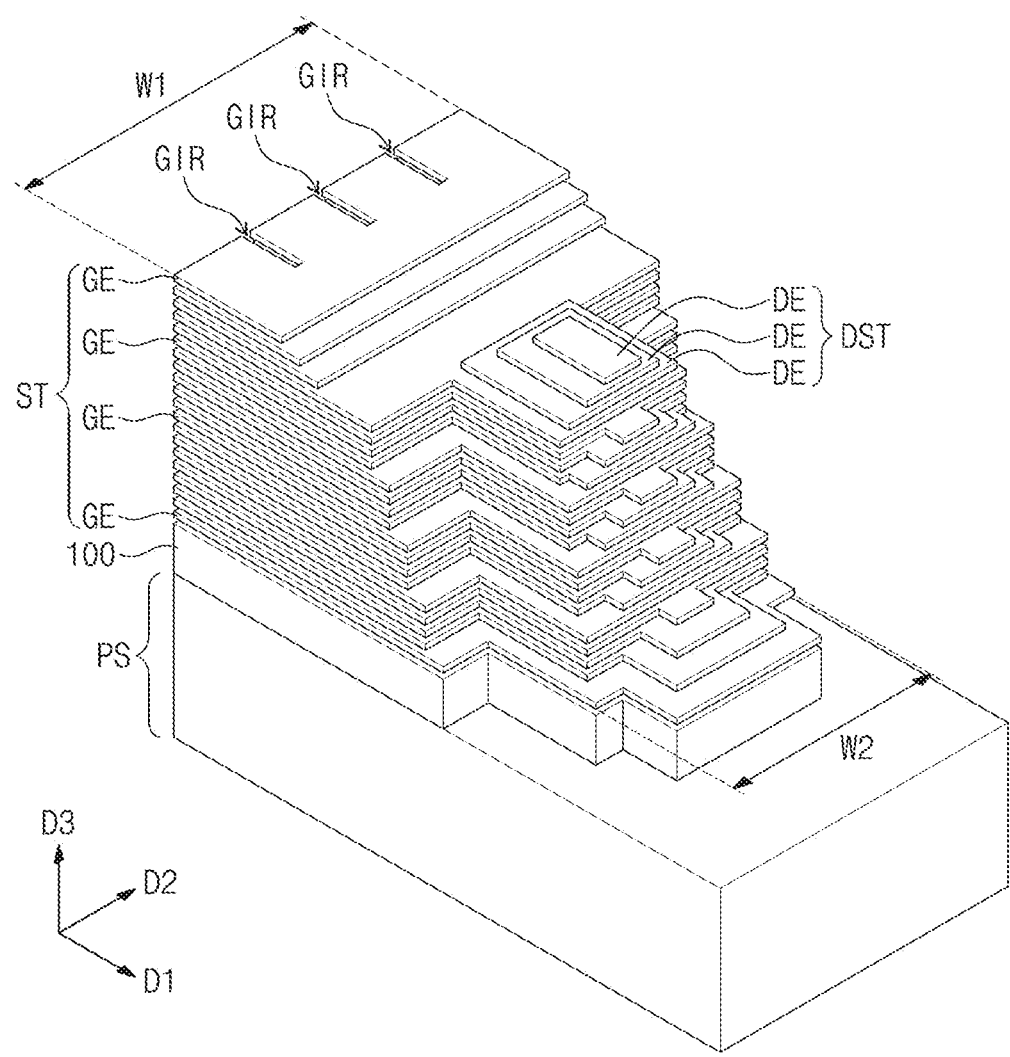
FIG. 10 illustrates a perspective view showing an electrode structure of the three-dimensional semiconductor memory device of FIG. 5.
Figure 11:
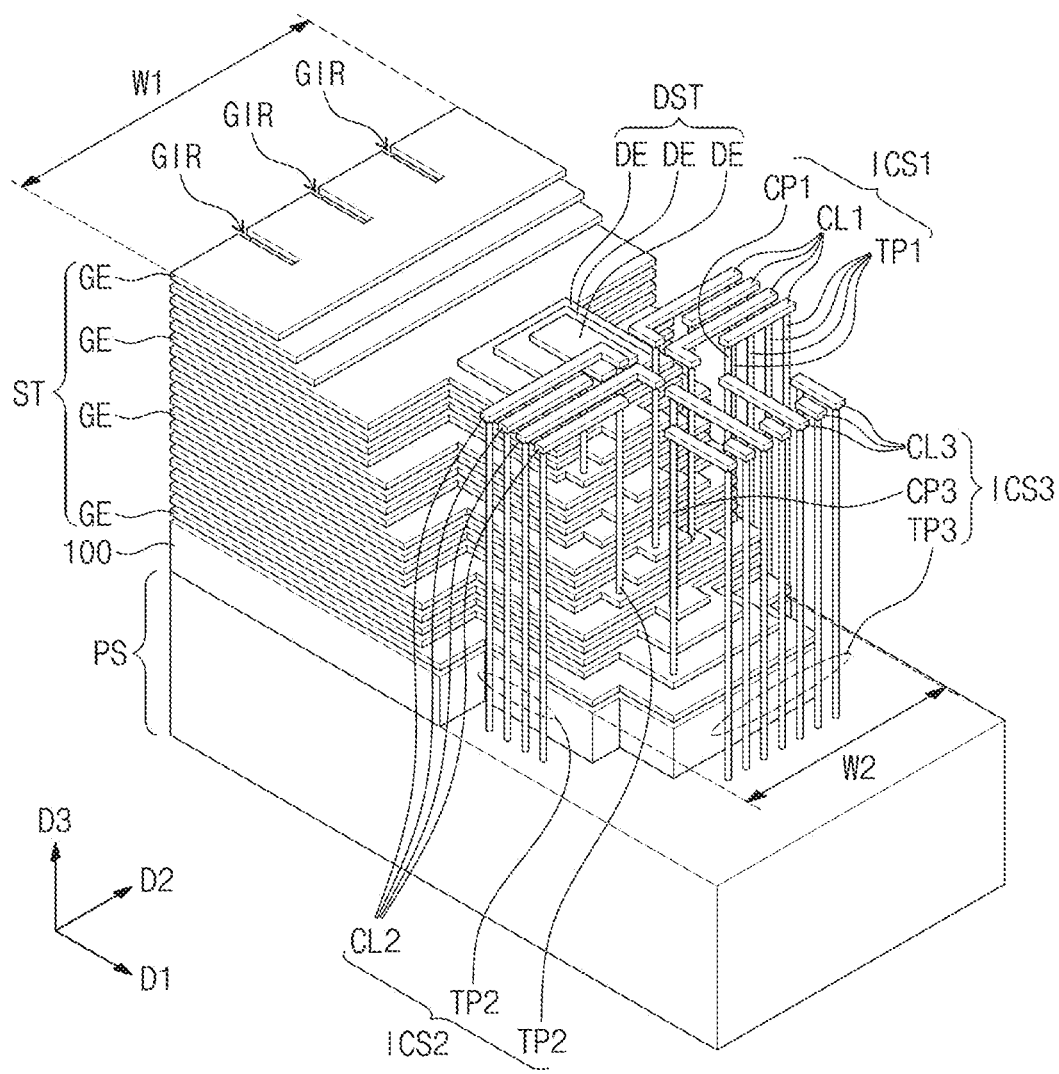
FIG. 11 illustrates a perspective view showing interconnection structures of the three-dimensional semiconductor memory device of FIG. 5.

FIG. 10 illustrates a perspective view showing an electrode structure of the three-dimensional semiconductor memory device of FIG. 5. FIG. 11 illustrates a perspective view showing interconnection structures of the three-dimensional semiconductor memory device of FIG. 5.

Referring to FIGS. 5, 6, 7, and 8, a three-dimensional semiconductor memory device may include a peripheral circuit structure PS, a cell array structure CS on the peripheral circuit structure PS, and interconnection structures ICS1, ICS2, and ICS3 that connect the cell array structure CS to the peripheral circuit structure PS. FIG. 5 does not show a dummy electrode structure DST of FIG. 6 to simplify the drawing.

The peripheral circuit structure PS may include peripheral logic circuits integrated on a surface (e.g., an entire surface) of a semiconductor substrate 10 and may also include a peripheral buried dielectric layer 50 covering the peripheral logic circuits.

The semiconductor substrate 10 may be or include a silicon substrate, a silicon-germanium substrate, a germanium substrate, or a single crystalline epitaxial layer grown on a single crystalline silicon substrate. The semiconductor substrate 10 may include impurity-doped well regions and active regions defined by a device isolation layer 11.

The peripheral logic circuits may be or include row and column decoders, a page buffer, and control circuits, as discussed above with reference to FIG. 1. The peripheral circuit structure PS may include NMOS and PMOS transistors integrated on the semiconductor substrate 10, low-voltage and high-voltage transistors, and resistors. The peripheral circuit structure PS may further include pass transistors PTR that control word lines.

Each of the pass transistors PTR may include a peripheral gate electrode 23 disposed on the semiconductor substrate 10 with a gate dielectric layer 21 interposed therebetween and source/drain regions 25 formed in the semiconductor substrate 10 on opposite sides of the peripheral gate electrode 23. Peripheral circuit lines 33 may be connected to the pass transistors PTR through peripheral contact plugs 31.

On the semiconductor substrate 10, the peripheral buried dielectric layer 50 may cover the pass transistors PTR, the peripheral contact plugs 31, and the peripheral circuit lines 33. The peripheral buried dielectric layer 50 may include a plurality of stacked dielectric layers.

The cell array structure CS may be disposed on the peripheral buried dielectric layer 50 and may include a horizontal semiconductor layer 100, an electrode structure ST, vertical structures VS, and the interconnection structures ICS1, ICS2, and ICS3.

The horizontal semiconductor layer 100 may be disposed on the peripheral buried dielectric layer 50 of the peripheral circuit structure PS. The horizontal semiconductor layer 100 may expose a portion of the peripheral buried dielectric layer 50.

The horizontal semiconductor layer 100 may include a cell array region CAR and a connection region CNR. The horizontal semiconductor layer 100 may include a semiconductor material, such as silicon (Si), germanium (Ge), silicon germanium (SiGe), gallium arsenic (GaAs), indium gallium arsenic (InGaAs), aluminum gallium arsenic (AlGaAs), or a mixture thereof. The horizontal semiconductor layer 100 may include a semiconductor doped with first conductivity impurities or an intrinsic semiconductor without doped impurities. The horizontal semiconductor layer 100 may have at least one selected from a single crystalline structure, an amorphous structure, and a polycrystalline structure.

A plurality of electrode structures ST may be disposed on the horizontal semiconductor layer 100. The plurality of electrode structures ST may extend in a first direction D1 on the horizontal semiconductor layer 100, and may be spaced apart from each other in a second direction D2 intersecting the first direction D1. In some embodiments, the horizontal semiconductor layer 100 may include opposing first and second surfaces. The electrode structure ST may be on the first surface of the horizontal semiconductor layer 100, and the second surface of the horizontal semiconductor layer 100 may face the semiconductor substrate 10, as illustrated in FIG. 6. The first and second surfaces of the horizontal semiconductor layer 100 may be parallel to a surface of the semiconductor substrate 10, as illustrated in FIG. 6. Both the first direction D1 and the second direction D2 may be parallel to the first and second surfaces of the horizontal semiconductor layer 100.

Each of the electrode structures ST may include electrodes GE and interlayer dielectric layers ILD that are alternately stacked along a third direction D3 (or a vertical direction) perpendicular to the first and second directions D1 and D2. The electrode structure ST may include a lower section, an intermediate section, and an upper section that are sequentially provided along the third direction D3 on the horizontal semiconductor layer 100. Each of the lower, intermediate, and upper sections may include a group of the electrodes GE.

In each electrode structure ST, the electrodes GE may be stacked to have a stair-step structure on the connection region CNR. Therefore, each electrode structure ST may have a height that decreases with increasing distance from the cell array region CAR. The electrodes GE of each electrode structure ST may have lengths in the first direction D1 that decrease with increasing distance from the horizontal semiconductor layer 100.

As discussed above with reference to FIGS. 4A to 4E, each electrode structure ST may include an electrode portion having a first width W1 on the cell array region CAR, a pad portion having a second width W2 on the connection region CNR, and the second width W2 is less than the first width W1. The electrode structures ST may be spaced apart from each other in the second direction D2 by a first distance S1 on the cell array region CAR and may be spaced apart from each other in the second direction D2 by a second distance S2 on the connection region CNR, which second distance S2 is greater than the first distance S1.

Referring to FIG. 5, the pad portion of the electrode structure ST may include opposing side surfaces, first and second side surfaces SS1 and SS2, that are spaced apart from each other in the second direction D2 and a third side surface SS3 that connects the first and second side surfaces SS1 and SS2 to each other.

In some embodiments, a lowermost electrode GE_L that is closest to the horizontal semiconductor layer 100 in the third direction D3 may have a width in the second direction D2 greater than a width of one of upper electrodes GE U in the second direction D2, as illustrated in FIG. 8. It will be understood that a width of the electrode structure ST in the second direction D2 may decrease as a distance from the horizontal semiconductor layer 100 increases.

Referring to FIGS. 5, 6, and 10, the pad portion of the electrode structure ST may include a first stair-step structure that is formed along the first direction D1 and second stair-step structures that are formed along the second direction D2. The first stair-step staircase structure may have a different slope from those of the second stair-step structures. On the connection region CNR, the electrodes GE of the electrode structure ST may have exposed portions that are not covered with next overlying electrodes. On the connection region CNR, a lowermost one of the electrodes GE may have a second width W2 that is a largest width among widths of the electrodes GE, and the widths of the electrodes GE may decrease with increasing distance from the horizontal semiconductor layer 100.

In some embodiments, a pad portion of a lowermost one of the electrodes GE, which is closest to the horizontal semiconductor layer 100, may have a second width W2 near an electrode portion of the lowermost one of the electrodes GE, as illustrated in FIG. 10. It will be understood that "a width of a pad portion of an electrode structure ST" may refer to a widest width of an electrode included in the electrode structure ST.

A dummy electrode structure DST may be disposed on the electrode structure ST on the connection region CNR and may include dummy electrodes DE and dummy dielectric layers DI that are alternately stacked in the third direction D3. The dummy electrodes DE may be horizontally spaced apart from the electrodes GE at the upper section of the electrode structure ST. An uppermost one of the dummy electrodes DE in the dummy electrode structure DST may be located at substantially the same level as that of an uppermost one of the electrode GE in the electrode structure ST.

In some embodiments, the dummy electrode structure DST may have a first stair-step structure defined along the first direction D1 toward the cell array region CAR and opposing second stair-step structures, each of which is defined along the second direction D2, as illustrated in FIG. 10. The dummy electrodes DE may have vertically aligned sidewalls.

In some example embodiments, electrode separation regions ESR may be provided between the electrode structures ST. The electrode separation regions ESR may extend along the first direction D1 from the cell array region CAR toward the connection region CNR.

On the cell array region CAR, each of the electrode structures ST may include gate dielectric regions GIR that penetrate the electrode structure ST. The gate dielectric regions GIR may extend in parallel in the first direction D1 and may be spaced apart from each other in the second direction D2. The gate dielectric regions GIR may have lengths in the first direction D1, which lengths are less than that in the first direction D1 of the electrode portion of the electrode structure ST. FIG. 5 shows that three gate dielectric regions GIR are provided in each electrode structure ST, but the number of the gate dielectric regions GIR may be changed depending on integration and/or process conditions of three-dimensional semiconductor memory devices.

Referring to FIGS. 6 and 7, on the cell array region CAR, the vertical structures VS may penetrate the electrode structure ST. When viewed in plan, although not shown in FIG. 5, the vertical structures VS may be arranged along rows and columns and disposed in a zigzag fashion. The vertical structures VS may include a semiconductor material, such as silicon (Si), germanium (Ge), or a mixture thereof. The vertical structures VS including a semiconductor material may serve as channels of the string and ground select transistors SST and GST, the memory cell transistors MCT, and the dummy cell transistors DMC discussed with reference to FIG. 2.

The vertical structures VS may be connected to the horizontal semiconductor layer 100. Each of the vertical structures VS may have a macaroni or pipe shape whose bottom end is closed. This shaped vertical structure VS may be filled in its inside with a buried dielectric pattern VI, as shown in FIG. 9.

Referring to FIG. 9 together with FIGS. 6 and 7, a vertical dielectric pattern VP may be disposed between the electrode structure ST and the vertical structure VS. The vertical dielectric pattern VP may have a macaroni or pipe shape whose top and bottom ends are opened. The vertical dielectric pattern VP may extend in the third direction D3 and surround a sidewall of the vertical structure VS.

In some example embodiments, the vertical dielectric pattern VP may include a tunnel dielectric layer TIL, a charge storage layer CIL, and a blocking dielectric layer BIL, and those layers TIL, CIL, and BIL may constitute a data storage layer of a NAND Flash memory device. For example, the charge storage layer CIL may be a trap dielectric layer, a floating gate electrode, or a dielectric layer including conductive nanodots. For example, the vertical dielectric pattern VP may include a thin film for a phase change memory device or variable resistance memory device.

A horizontal dielectric pattern HP may be disposed between the vertical dielectric pattern VP and sidewalls of the electrodes GE and may extend onto top and bottom surfaces of each electrode GE. In some example embodiments, the horizontal dielectric pattern HP may include a charge storage layer serving as a portion of a data storage layer used in an NAND Flash memory device.

Referring back to FIGS. 6, 7, and 8, on the peripheral buried dielectric layer 50, an upper planarized dielectric layer 150 may cover the stair-step structure of the electrode structure ST. The upper planarized dielectric layer 150 may have a substantially flat top surface, which top surface may be located at substantially the same level as that of a top surface of the electrode structure ST.

First and second interlayer dielectric layers 151 and 153 may be sequentially stacked on the upper planarized dielectric layer 150 and may cover top surfaces of the vertical structures VS.

Bit lines BL may extend in the second direction D2 on the cell array region CAR, while running across the electrode structure ST. The bit lines BL may be electrically connected to the vertical structures VS through bit line contact plugs BPLG.

Referring to FIGS. 5, 6, 8, and 11, the interconnection structures ICS1, ICS2, and ICS3 may be provided around the pad portions of the electrode structures ST. The interconnection structures ICS1, ICS2, and ICS3 may include contact plugs CP1, CP2, and CP3, through plugs TP1, TP2, and TP3, and conductive lines CL1, CL2, and CL3. The contact plugs CP1, CP2, and CP3 and the conductive lines CL1, CL2, and CL3 may vertically connect the electrode structure ST to the peripheral circuit structure PS. In some example embodiments, ones of the interconnection structures ICS1, ICS2, and ICS3 may be disposed between the pad portions of the electrode structures ST directly adjacent to each other in the second direction D2.

In some example embodiments, the interconnection structures ICS1, ICS2, and ICS3 may include a first interconnection structure ICS1 adjacent to the first side surface SS1 of the pad portion having the second width W2 of the electrode structure ST, a second interconnection structure ICS2 adjacent to the second side surface SS2 of the pad portion, and a third interconnection structure ICS3 adjacent to the third side surface SS3 of the pad portion.

The first interconnection structure ICS1 may include first contact plugs CP1 connected to first electrodes of the electrodes GE of the electrode structure GE, first conductive lines CL1, each of which has a major axis in the second direction D2 and is connected to a corresponding one of the first contact plugs CP1, and first through plugs TP1 that connect the first conductive lines CL1 to ones of peripheral circuit lines 33 of the peripheral circuit structure PS. For example, the first through plugs TP1 may be electrically connected to the pass transistors PTR of the logic circuit structure PS.

For example, the first contact plugs CP1 may be disposed adjacent to the first side surface SS1 of the electrode structure ST and may be coupled to (e.g., electrically connected to) corresponding odd-numbered electrodes of the electrode structure ST. The first through plugs TP1 may penetrate the first and second interlayer dielectric layers 151 and 153, the upper planarized dielectric layer 150, and the peripheral buried dielectric layer 50 and may be disposed adjacent to the first side surface SS1 of the electrode structure ST. On the second interlayer dielectric layer 153, the first conductive lines CL1 may connect the first contact plugs CP1 to corresponding first through plugs TP1.

The second interconnection structure ICS2 may include second contact plugs CP2 connected to second electrodes of the electrodes GE of the electrode structure GE, second conductive lines CL2, each of which has a major axis in the second direction D2 and is connected to a corresponding one of the second contact plugs CP2, and second through plugs TP2 that connect the second conductive lines CL2 to ones of the peripheral circuit lines 33 of the peripheral circuit structure PS.

The second contact plugs CP2 may be disposed adjacent to the second side surface SS2 of the electrode structure ST and may be coupled to (e.g., electrically connected to) corresponding even-numbered electrodes of the electrode structure ST. The second through plugs TP2 may penetrate the first and second interlayer dielectric layers 151 and 153, the upper planarized dielectric layer 150, and the peripheral buried dielectric layer 50, and may be disposed adjacent to the second side surface SS2 of the electrode structure ST. For example, the second through plugs TP2 may be electrically connected to the pass transistors PTR of the logic circuit structure PS. On the second interlayer dielectric layer 153, the second conductive lines CL2 may connect the second contact plugs CP2 to corresponding second through plugs TP2.

The third interconnection structure ICS3 may include third contact plugs CP3 connected to third electrodes of the electrodes GE of the electrode structure GE, third conductive lines CL3, each of which has a major axis in the first direction D1 and is connected to a corresponding one of the third contact plugs CP3, and third through plugs TP3 that connect the third conductive lines CL3 to ones of the peripheral circuit lines 33 of the peripheral circuit structure PS.

When viewed in plan, the third contact plugs CP3 may be disposed adjacent to the third side surface SS3 of the electrode structure ST. The third contact plugs CP3 may be coupled to (e.g., electrically connected to) corresponding electrodes at the lower section of the electrode structure ST. The third through plugs TP3 may penetrate the first and second interlayer dielectric layers 151 and 153, the upper planarized dielectric layer 150, and the peripheral buried dielectric layer 50, and may be disposed adjacent to the third side surface SS3 of the electrode structure ST. For example, the third through plugs TP3 may be electrically connected to the pass transistors PTR of the logic circuit structure PS. On the second interlayer dielectric layer 153, the third conductive lines CL3 may connect the third contact plugs CP3 to corresponding third through plugs TP3.

In some example embodiments, because the electrode structure ST has a smaller width on the connection region CNR than on the cell array region CAR, the electrode structures ST may have an increased space therebetween on the connection region CNR. Therefore, the conductive lines CL1, CL2, and CL3 of the interconnection structures ICS1, ICS2, and ICS3 may be connected in the third direction D3 to the electrode structure ST. In such cases, the interconnection structures ICS1, ICS2, and ICS3 including the conductive lines CL1, CL2, and CL3 may have increased occupied areas on the connection region CNR. As a result, the conductive lines CL1, CL2, and CL3 connected to the electrode structure ST may increase a degree of wiring freedom, and an integration density of three-dimensional semiconductor memory devices may increase.

FIGS. 12A, 12B, 12C, and 12D illustrate plan views showing a three-dimensional semiconductor memory device according to some example embodiments of the present inventive concepts. FIG. 13 illustrates a perspective view showing an electrode structure of the three-dimensional semiconductor memory device of FIG. 12A. FIG. 14 illustrates a perspective view showing interconnection structures of the three-dimensional semiconductor memory device of FIG. 12A.

For brevity of explanation, a detailed description of technical features the same as those of the three-dimensional semiconductor memory device discussed above may be omitted, and a difference thereof will be described.

Figure 12B:
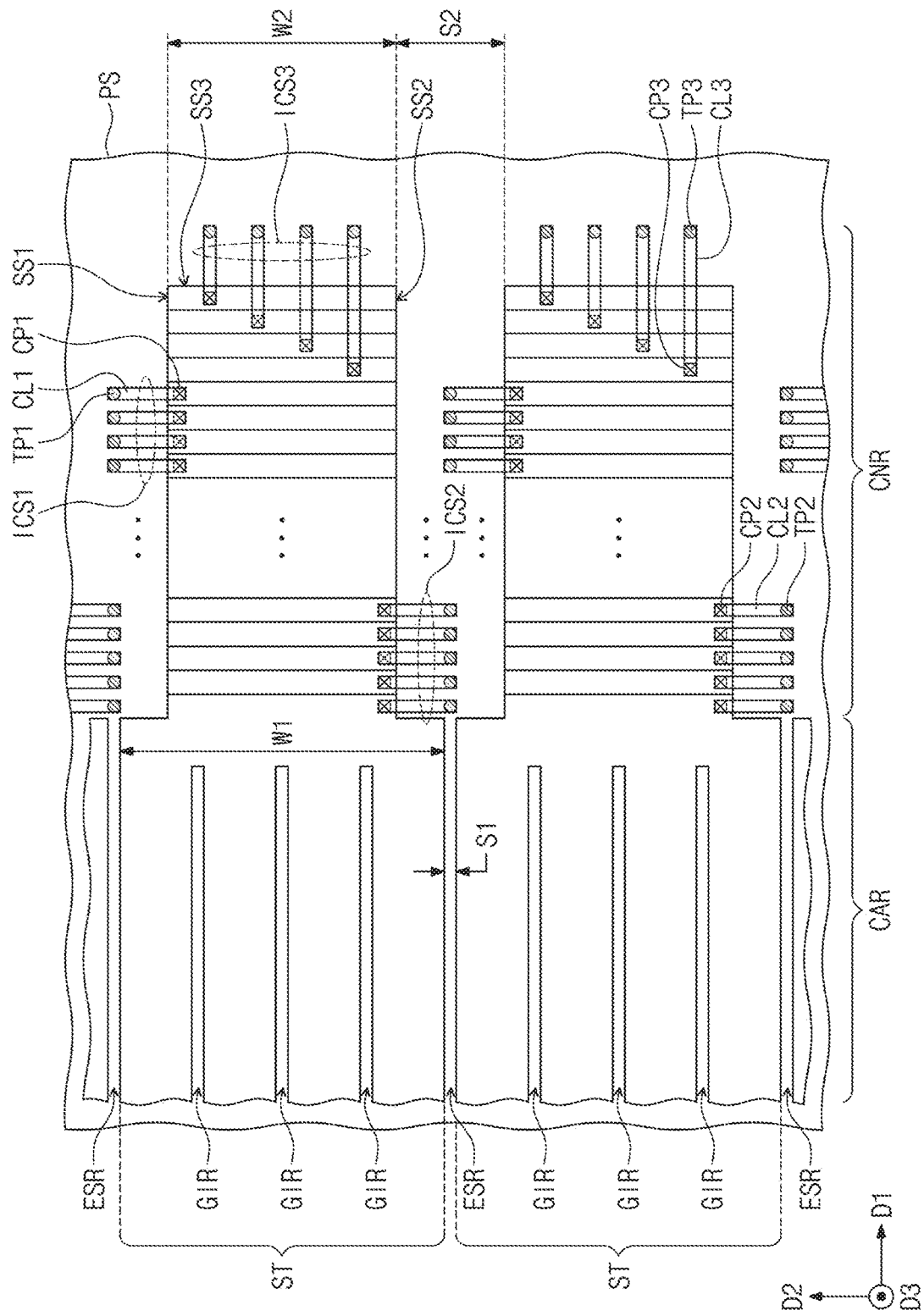
Figure 13:
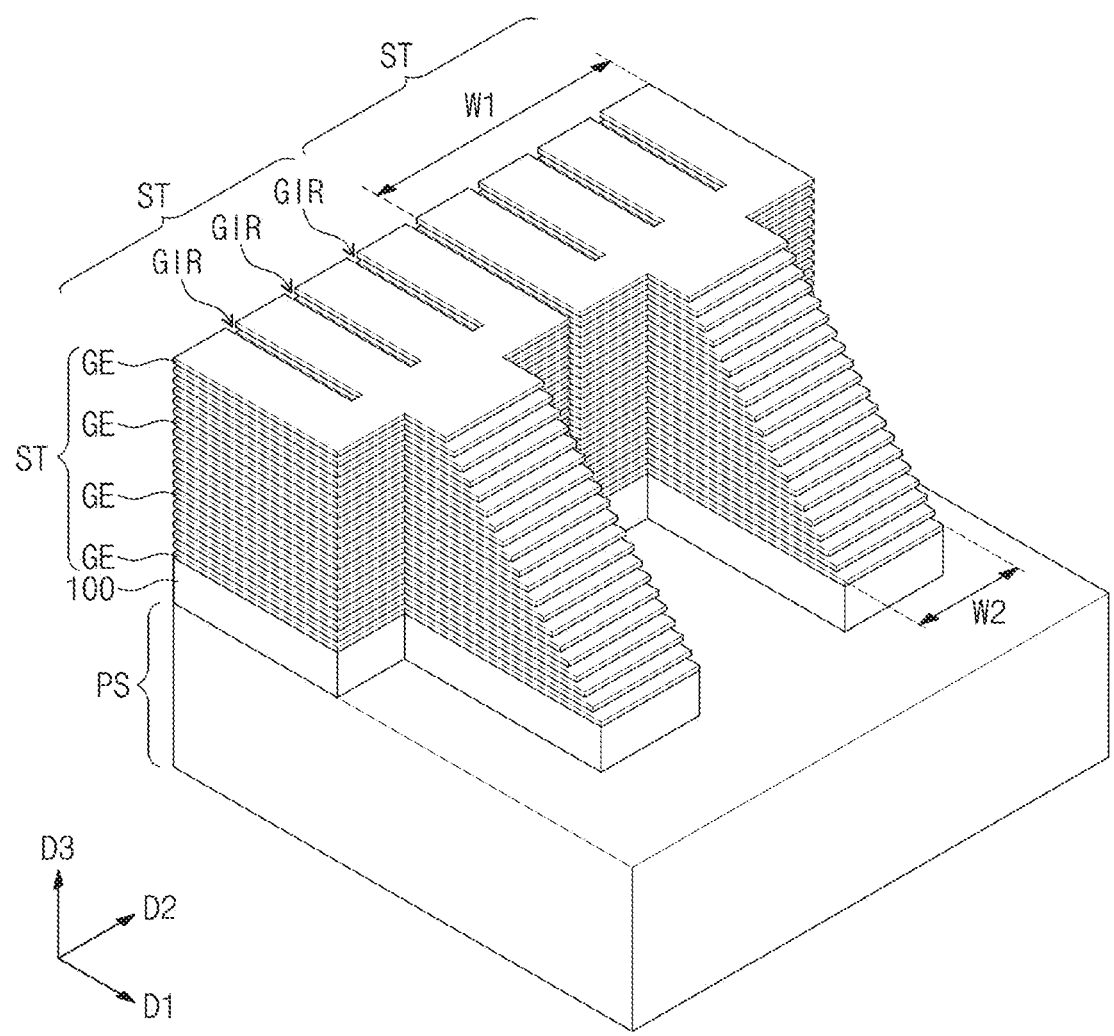
FIG. 13 illustrates a perspective view showing an electrode structure of the three-dimensional semiconductor memory device of FIG. 12A.
Figure 14:
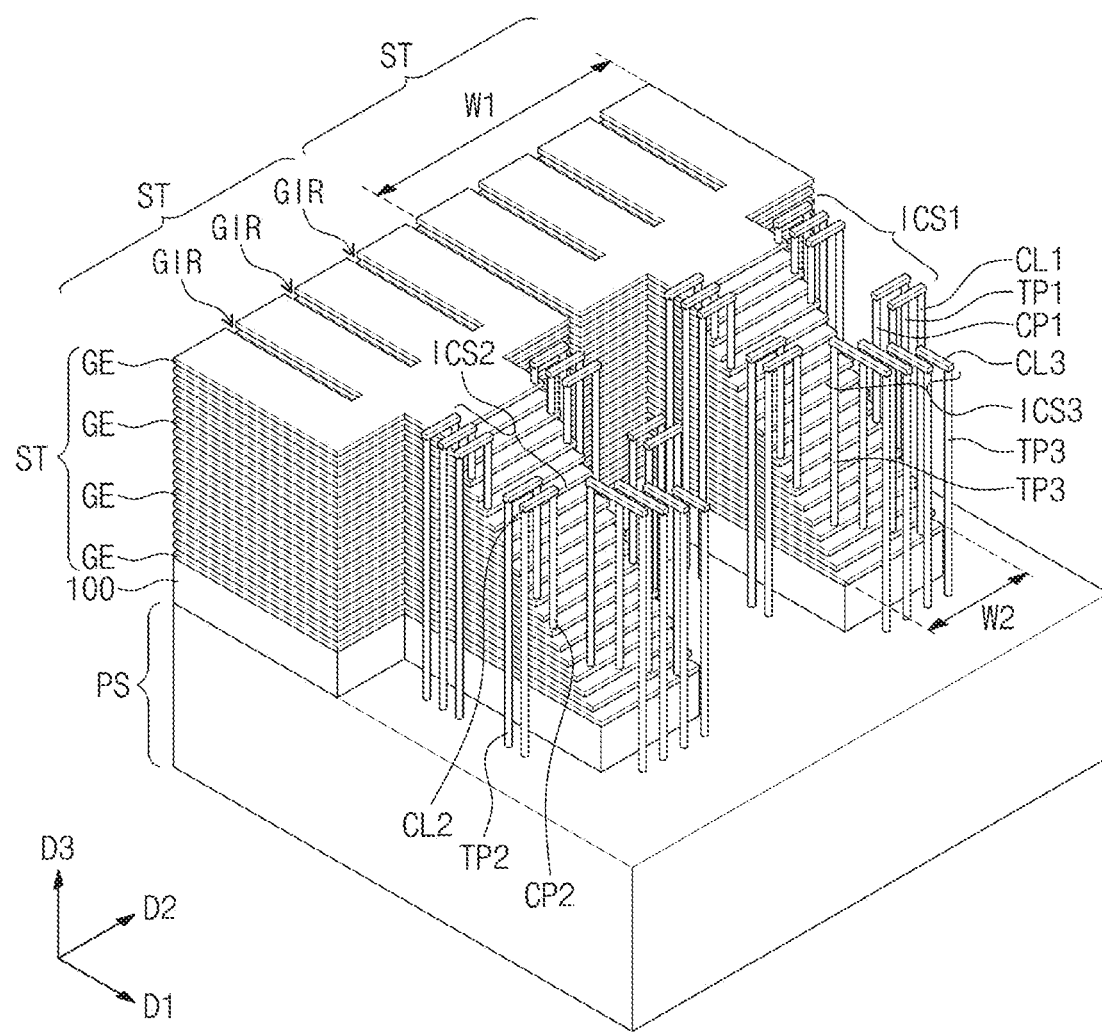
FIG. 14 illustrates a perspective view showing interconnection structures of the three-dimensional semiconductor memory device of FIG. 12A.

Referring to FIGS. 12A, 12B, and 13, the electrode structures ST may extend along the first direction D1 and may be spaced apart from each other in the second direction D2. As discussed above with reference to FIGS. 4A to 4E, each of the electrode structures ST may include the electrode portion having a first width W1 on the cell array region CAR and the pad portion having a second width W2 on the connection region CNR. The second width W2 may be less than the first width W1. The electrode structures ST may be spaced apart from each other in the second direction D2 by a first distance S1 on the cell array region CAR and may be spaced apart from each other in the second direction D2 by a second distance S2 on the connection region CNR. The second distance S2 may be greater than the first distance S1.

The pad portion of the electrode structure ST may have a first stair-step structure that is formed along the first direction D1. In each electrode structure ST, the electrodes GE may be stacked to have a stair-step structure on the connection region CNR. The electrodes GE may uniformly have a second width W2 on the connection region CNR. In some embodiments, each of the electrodes GE may have a uniform width in the second direction D2 along the first direction D1, as illustrated in FIG. 12A.

Referring to FIGS. 12A, 12B, and 14, as discussed above, the pad portion of the electrode structure ST may include the first and second side surfaces SS1 and SS2 that are spaced apart from each other in the second direction D2 and the third side surface SS3 that connects the first and second side surfaces SS1 and SS2 to each other.

The first interconnection structure ICS1 may be provided adjacent to the first side surface SS1 of the pad portion and may include the first contact plugs CP1, the first conductive lines CL1, and the first through plugs TP1. The first conductive lines CL1 may have their major axes in the second direction D2. In some embodiments, each of the first conductive lines CL1 may extend longitudinally in the second direction D2 as illustrated in FIG. 14. The second interconnection structure ICS2 may be provided adjacent to the second side surface SS2 of the pad portion and may include the second contact plugs CP2, the second conductive lines CL2, and the second through plugs TP2. The second conductive lines CL2 may have their major axes in the second direction D2. In some embodiments, each of the second conductive lines CL2 may extend longitudinally in the second direction D2 as illustrated in FIG. 14. The third interconnection structure ICS3 may be provided adjacent to the third side surface SS3 of the pad portion and may include the third contact plugs CP3, the third conductive lines CL3, and the third through plugs TP3. The third conductive lines CL3 may have their major axes in the first direction D1. In some embodiments, each of the third conductive lines CL3 may extend longitudinally in the first direction D1 as illustrated in FIG. 14.

Referring to FIGS. 12A and 14, the first contact plugs CP1 may be connected to ones of the odd-numbered electrodes, respectively, and the second contact plugs CP2 may be connected to ones of the even-numbered electrodes, respectively. The third contact plugs CP3 may be connected to corresponding electrodes at the lower section of the electrode structure ST. In some embodiments, as shown in FIG. 12B, the first contact plugs CP1 may be adjacent to the first side surface SS1 of the pad portion and may be connected to corresponding electrodes at the intermediate section of the electrode structure ST. The second contact plugs CP2 may be adjacent to the second side surface SS2 of the pad portion, and may be connected to corresponding electrodes at the upper section of the electrode structure ST.

Figure 12C:
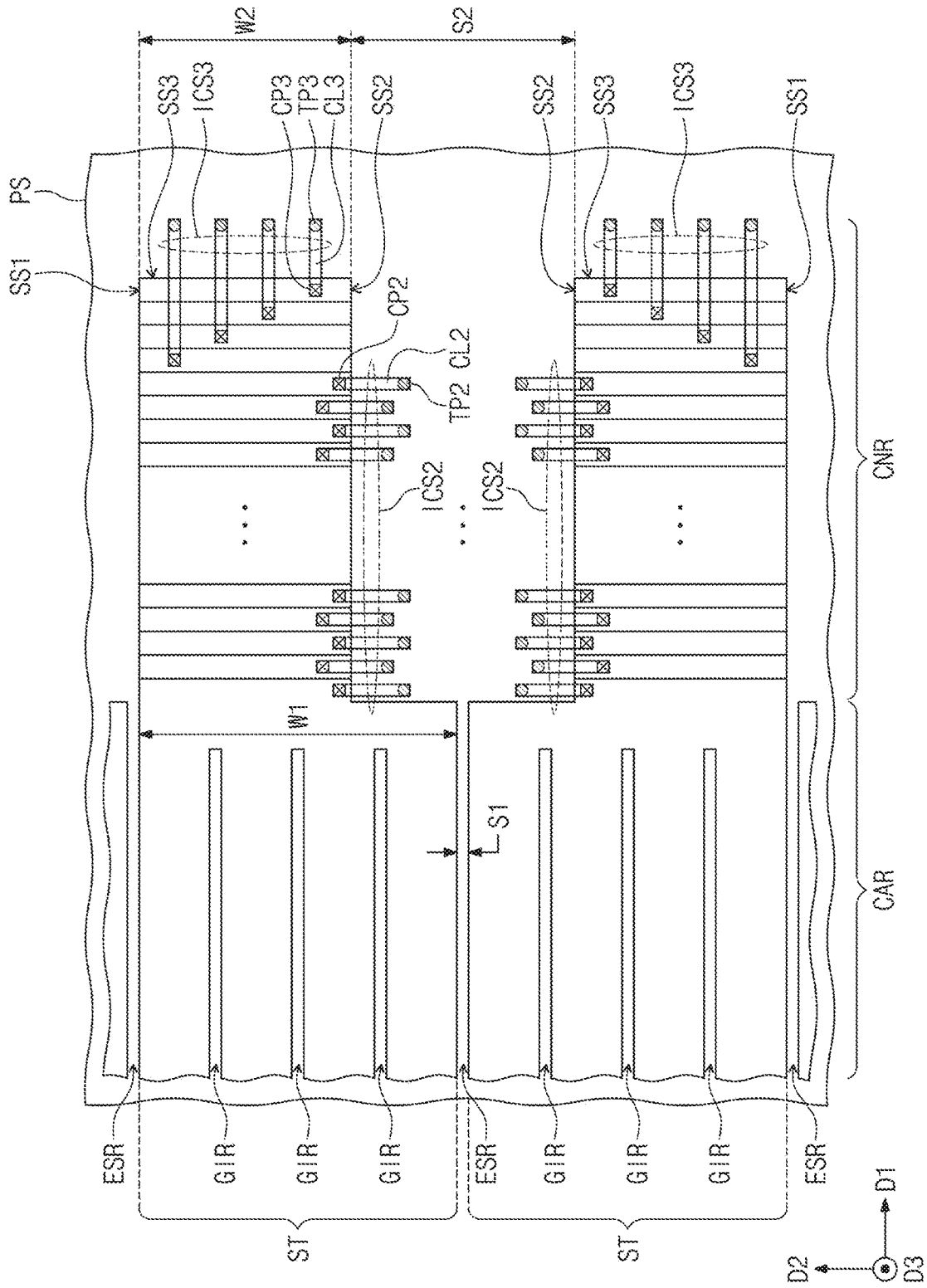

Referring to FIG. 12C, as discussed above, the pad portion of the electrode structure ST may include the first and second side surfaces SS1 and SS2 that are spaced apart from each other in the second direction D2 and the third side surface SS3 that connects the first and second side surfaces SS1 and SS2 to each other. The electrode structures ST may be spaced apart from each other in the second direction D2 and disposed mirror-symmetrically about an imaginary line parallel to the first direction D1. Thus, the second surfaces SS2 of neighboring electrode structures ST may be disposed to face each other.

In some embodiments, the first interconnection structure ICS1 illustrated in FIGS. 12A and 12B may not be provided as illustrated in FIG. 12C. The third contact plugs CP3 of the third interconnection structure ICS3 may be coupled to (e.g., electrically connected to) corresponding electrodes at the lower section of the electrode structure ST. The second contact plugs CP2 of the second interconnection structure ICS2 may be arranged adjacent to the second side surface SS2 and may be connected to corresponding electrodes at the intermediate and upper sections of the electrode structure ST.

Figure 12D:
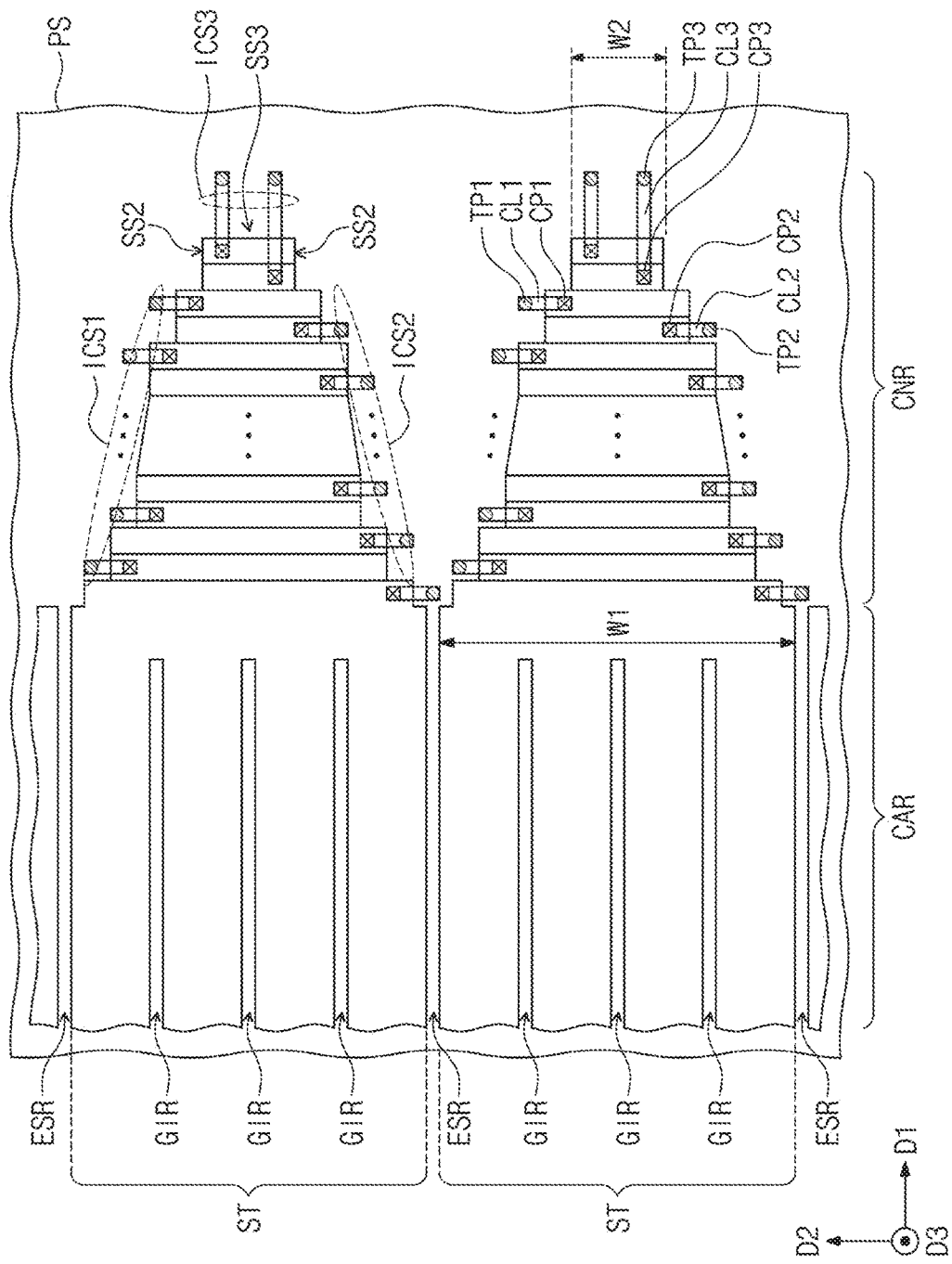

Referring to FIG. 12D, the pad portion of the electrode structure ST may have a first stair-step structure that is formed along the first direction D1. In each electrode structure ST, the electrodes GE may be stacked to have a stair-step structure on the connection region CNR and may have their widths that increase with increasing distance from the horizontal semiconductor layer 100 on the connection region CNR. A lowermost electrode of the electrode structure ST may have a minimum width W2 in the second direction D2. The interconnection structures ICS1, ICS2, and ICS3 may be provided around the pad portions of the electrode structures ST.

Figure 15:
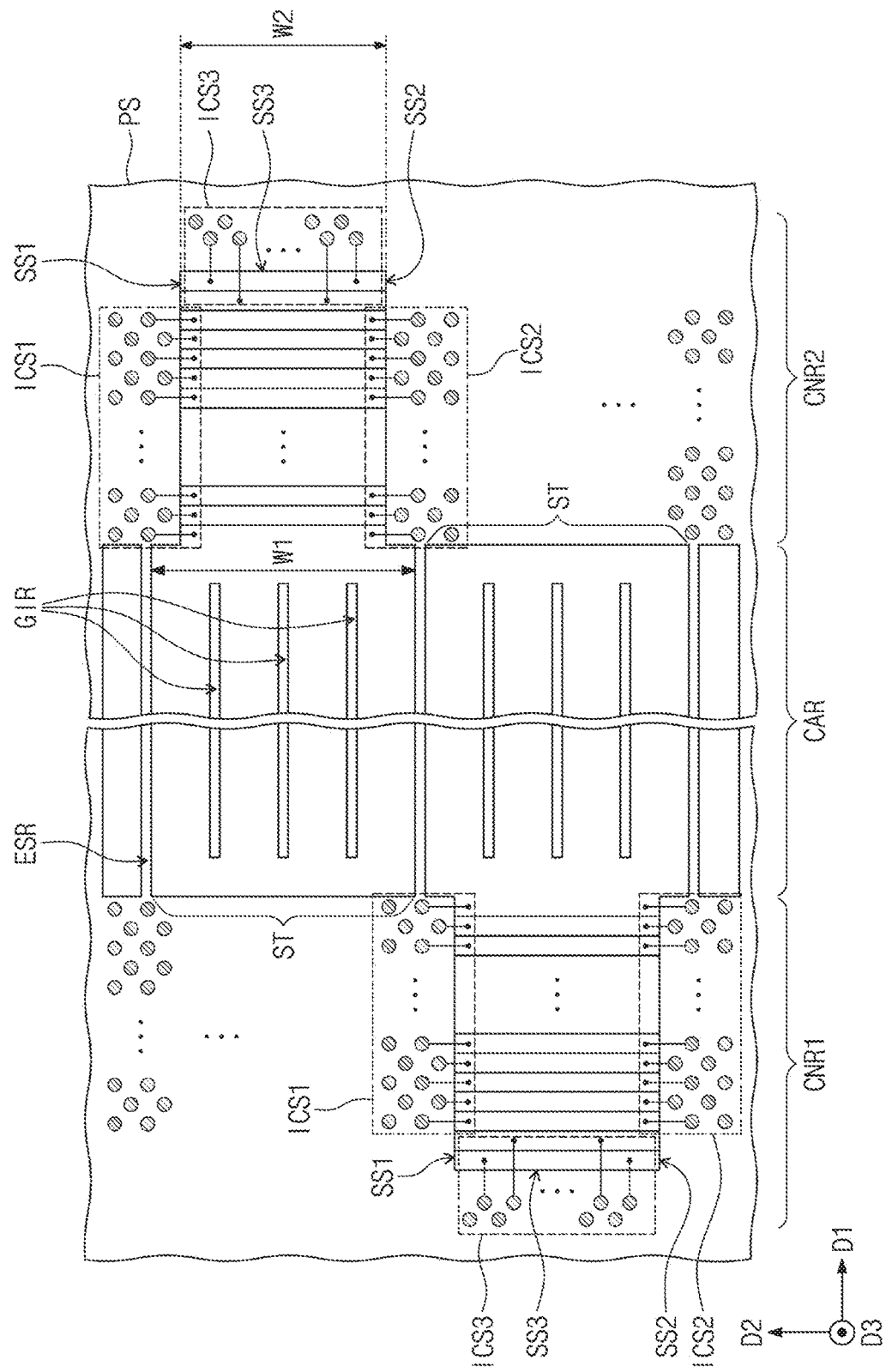
FIGS. 15 and 16 illustrate simplified plan views showing a three-dimensional semiconductor memory device according to some example embodiments of the present inventive concepts.
Figure 16:
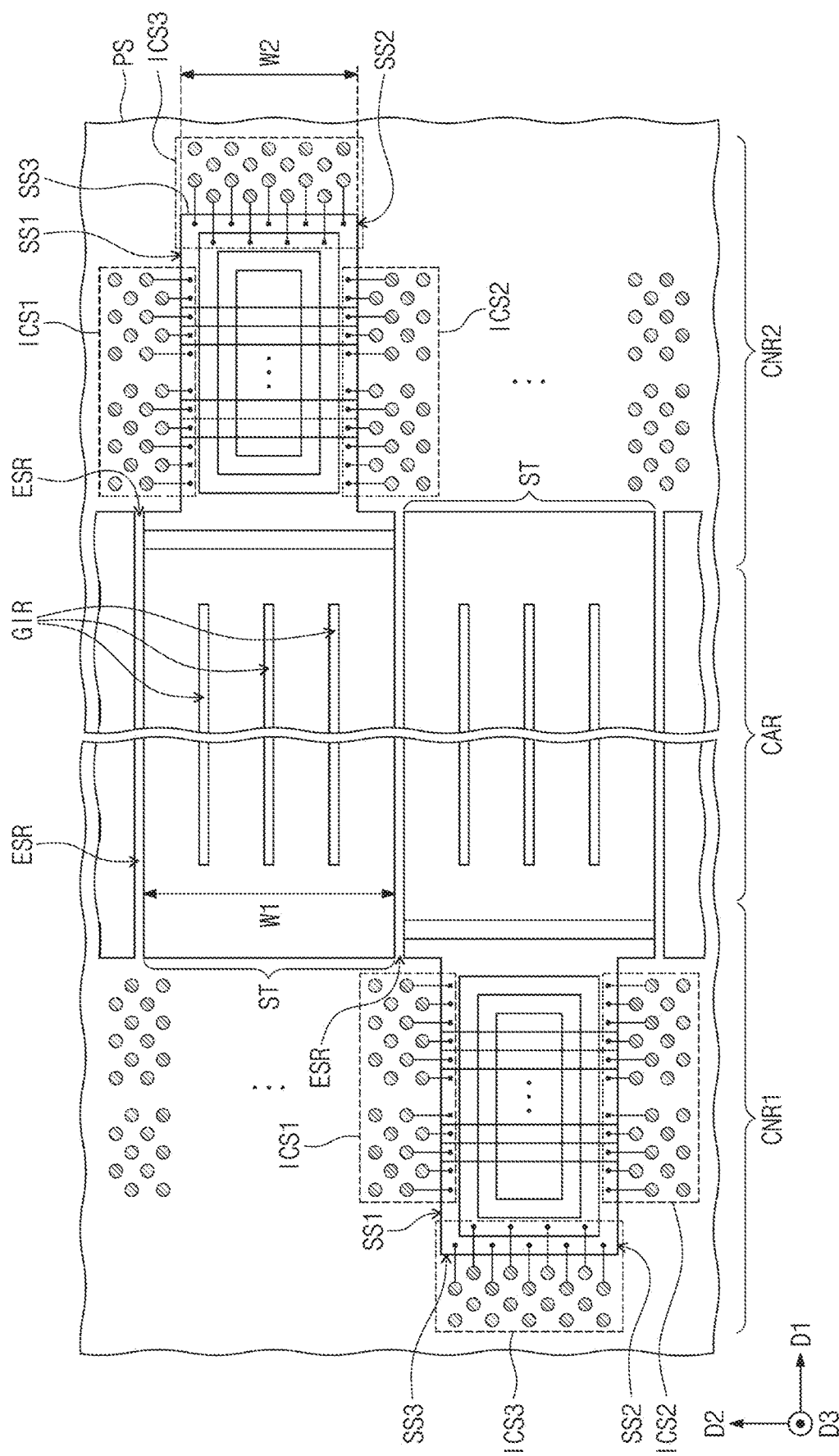

FIGS. 15 and 16 illustrate simplified plan views showing a three-dimensional semiconductor memory device according to some example embodiments of the present inventive concepts.

For brevity of explanation, a detailed description of technical features the same as those of the three-dimensional semiconductor memory device discussed above may be omitted, and a difference thereof will be described.

Referring to FIGS. 15 and 16, the horizontal semiconductor layer 100 may include a cell array region CAR, a first connection region CNR1 on one side of the cell array region CAR, and a second connection region CNR2 on other side of the cell array region CAR. The first and second connection regions CNR1 and CNR2 may be spaced apart in the first direction D1 from each other across the cell array region CAR.

A plurality of electrode structures ST may extend in the first direction D1 on the horizontal semiconductor layer 100, and the electrode separation regions ESR may separate the plurality of electrode structures ST from each other in the second direction D2.

Each of the electrode structures ST may include the electrode portion having a first width W1 on the cell array region CAR and the pad portion having a second width W2 on one of the first and second connection regions CNR1 and CNR2. The second width W2 may be less than the first width W1.

As shown in FIG. 15, the pad portion of the electrode structure ST may have a stair-step structure that is formed along the first direction D1. As shown in FIG. 16, the pad portion of the electrode structure ST may have stair-step structures that are formed along the first and second directions D1 and D2. As discussed above, the first, second, and third interconnection structures ICS1, ICS2, and IC3 may be disposed around the pad portion of the electrode structure ST.

FIGS. 17A to 17E illustrate perspective views showing a method of forming an electrode structure of a three-dimensional semiconductor memory device according to some example embodiments of the present inventive concepts.

In some example embodiments, the following patterning method may be used to form electrode structures illustrated in FIGS. 5 to 11. For example, the electrodes discussed with reference to FIGS. 5 to 11 may be formed by the patterning method described below.

Figure 17A:
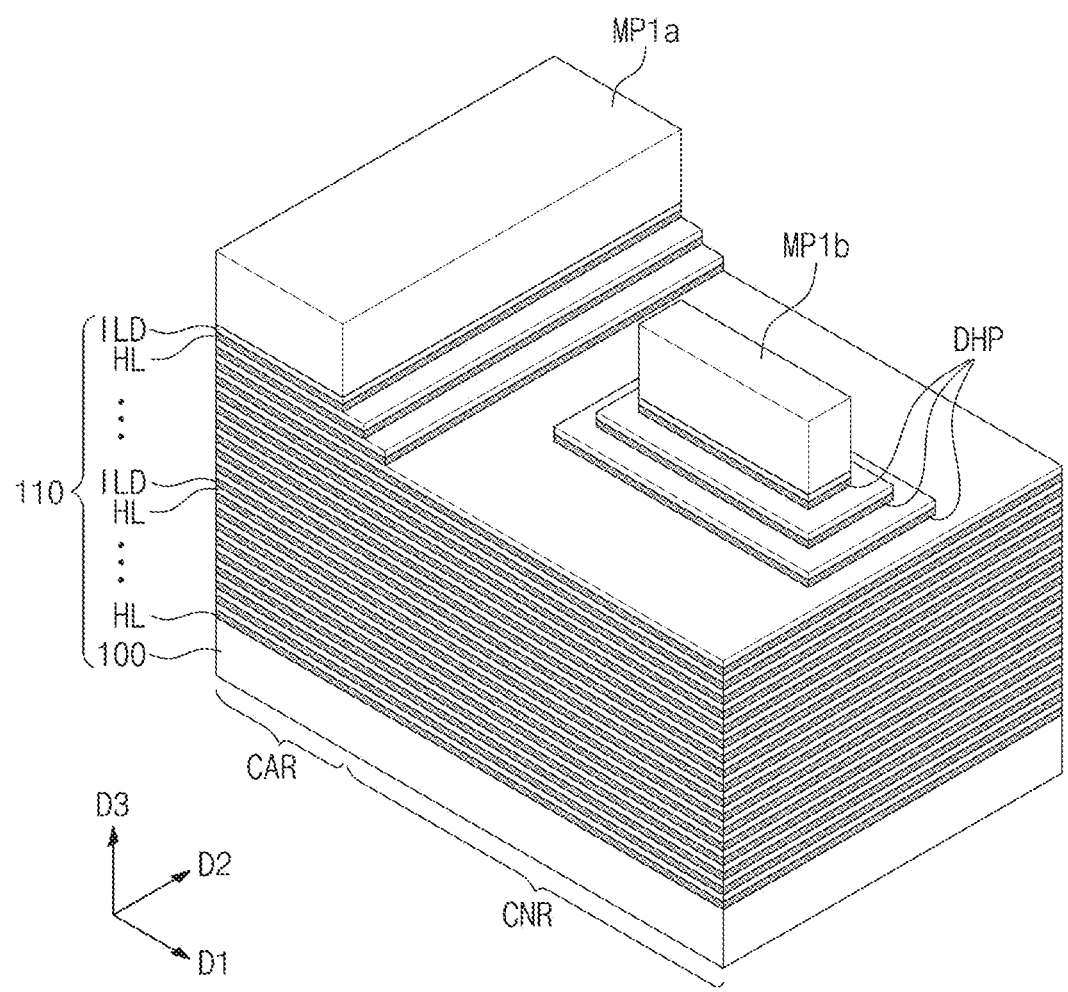
FIGS. 17A to 17E illustrate perspective views showing a method of forming an electrode structure of a three-dimensional semiconductor memory device according to some example embodiments of the present inventive concepts.

Referring to FIG. 17A, a thin-layer structure 110 may be formed on a horizontal semiconductor layer 100 that includes a cell array region CAR and a connection region CNR. The thin-layer structure 110 may include horizontal layers HL and interlayer dielectric layers ILD that are vertically and alternately stacked on the horizontal semiconductor layer 100. For example, the horizontal layers HL and the interlayer dielectric layers ILD may be alternately stacked along a third direction D3. The horizontal layers HL may be formed of a material having an etch selectivity with respect to the interlayer dielectric layers ILD. For example, the interlayer dielectric layers ILD may include a silicon oxide layer, and the horizontal layers HL may include one or more of a silicon nitride layer, a silicon oxynitride layer, a polycrystalline silicon layer, and a metal layer. In some example embodiments, the horizontal layers HL may be formed of the same material.

On the connection region CNR, an upper portion of the thin-layer structure 110 may be patterned to form dummy horizontal patterns DHP. The dummy horizontal patterns DHP may be patterned to have a substantially pyramidal structure on the connection region CNR. The dummy horizontal patterns DHP may be stacked to have stair-step structures in four directions.

The formation of the dummy horizontal patterns DHP may include forming a first mask pattern MP1a and MP1b on the thin-layer structure 110, performing a first etching process in which the first mask pattern MP1a and MP1b is used as an etching mask to anisotropically etch the upper portion of the thin-layer structure 110, and performing a first trimming process to reduce an area of the first mask pattern MP1a and MP1b. The first etching process may include etching one horizontal layer HL. The first etching process and the first trimming process may be repeatedly performed at least twice. FIG. 17A shows that the thin-layer structure 110 undergoes the first etching process and the first trimming process each of which is performed three times, but the present inventive concepts are not limited thereto.

The first mask pattern MP1a and MP1b may expose a portion of the thin-layer structure 110 on the connection region CNR. For example, the first mask pattern MP1a and MP1b may include a first segment MP1a that covers the cell array region CAR and a portion of the connection region CNR, and also include one or more second segments MP1b that are spaced apart from the first segment MP1a and cover other portions of the connection region CNR. The second segment MP1b may have an island shape on the thin-layer structure 110. The first mask pattern MP1a and MP1b may be used to perform an anisotropic etching process on the interlayer dielectric layer ILD and the horizontal layer HL.

The first trimming process may be performed to reduce the area of the first mask pattern MP1a and MP1b. When the first trimming process is performed, the thin-layer structure 110 may increase in area exposed by the first mask pattern MP1a and MP1b. The first mask pattern MP1a and MP1b that undergoes the first trimming process may expose portions of the dummy horizontal patterns DHP that are formed in a previous step.

The first trimming process may cause sidewall of the first and second segments MP1a and MP1b to horizontally move certain distances in first and second directions D1 and D2. An isotropic dry or wet etching process may be used as the first trimming process. The first trimming process may reduce area and thickness of the first mask pattern MP1a and MP1b.

Figure 17B:
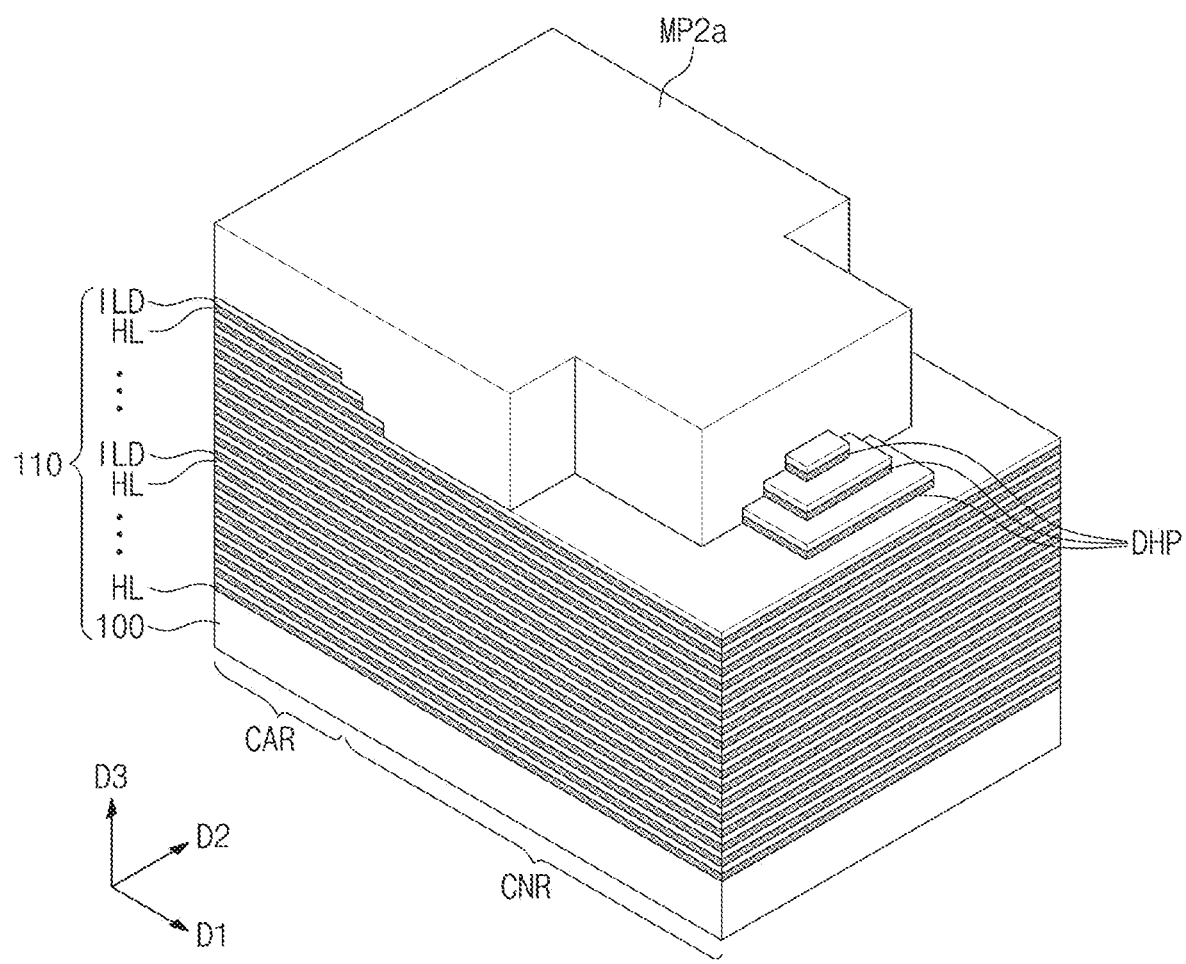

Referring to FIG. 17B, a second mask pattern MP2a may be provided to extend along the first direction D1 from the cell array region CAR toward the connection region CNR, covering the thin-layer structure 110 and exposing portions of the dummy horizontal patterns DHP. In such cases, the second mask pattern MP2a may partially expose a first stair-step structure along the first direction D1 of the dummy horizontal patterns DHP and a second stair-step structure along the second direction D2 of the dummy horizontal patterns DHP. The second mask pattern MP2a may have a greater width in the second direction D2 on the cell array region CAR than on the connection region CNR.

A second etching process may be performed in which the second mask pattern MP2a is used as an etching mask to etch the dummy horizontal patterns DHP and the thin-layer structure 110. The second etching process may etch at least two horizontal layers HL and portions of at least two dummy horizontal patterns DHP.

Figure 17C:
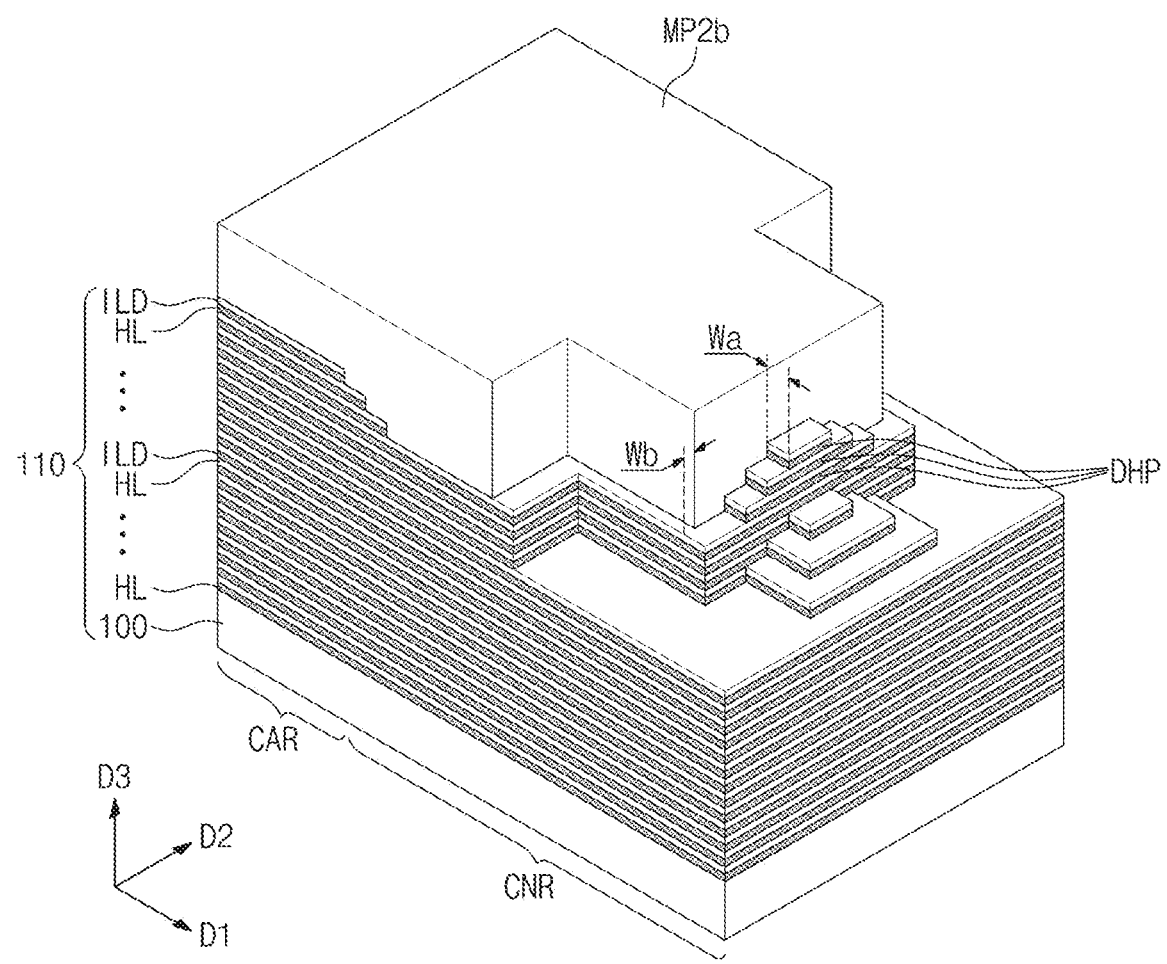

FIG. 17C shows that the second etching process is performed in which the second mask pattern MP2a is used to sequentially etch four horizontal layers HL. Referring to FIG. 17C, portions of the dummy horizontal patterns DHP may be etched such that the dummy horizontal patterns DHP may decrease in length in the first direction D1. The dummy horizontal patterns DHP may thus have sidewalls that are vertically aligned with each other. In addition, the second etching process may sequentially and anisotropically etch four horizontal layers HL below the dummy horizontal patterns DHP, and the first and second stair-step structures of the dummy horizontal patterns DHP may be transcribed on the horizontal layers HL.

After the second etching process, a second trimming process may be performed on the second mask pattern MP2a. The second trimming process may expand a region exposed by the second mask pattern MP2a, and as a result may partially expose the horizontal layers HL and the dummy horizontal patterns DHP that are formed in previous steps.

When the second trimming process is performed once, a sidewall of the second mask pattern MP2a may horizontally move a certain distance in the first and second directions D1 and D2. The sidewall of the second mask pattern MP2a may move a first horizontal distance Wa in the first direction D1 and a second horizontal distance Wb in the second direction D2. The second horizontal distance Wb may be substantially identical to or less than the first horizontal distance Wa. The second trimming process may convert the second mask pattern MP2a into a first-trimmed second mask pattern MP2b.

A second etching process may be performed in which the first-trimmed second mask pattern MP2b is used as an etching mask to etch the dummy horizontal patterns DHP and the thin-layer structure 110.

Figure 17D:
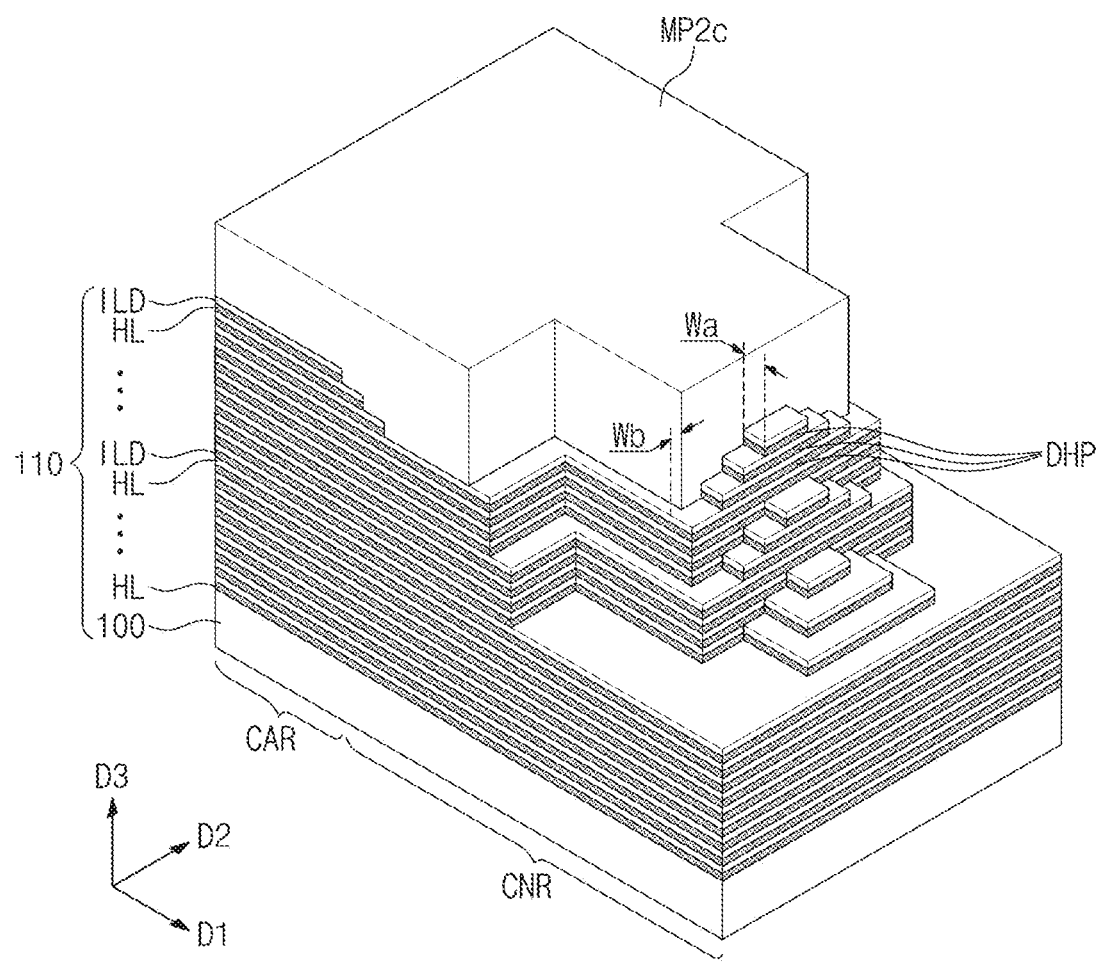

FIG. 17D shows that four horizontal layers HL are sequentially etched by the second etching process that uses the first-trimmed second mask pattern MP2b.

A second trimming process may be performed on the first-trimmed second mask pattern MP2b such that sidewalls of the first-trimmed second mask pattern MP2b may horizontally move in the first and second directions D1 and D2. As a result, a second-trimmed second mask pattern MP2c may be formed.

Figure 17E:
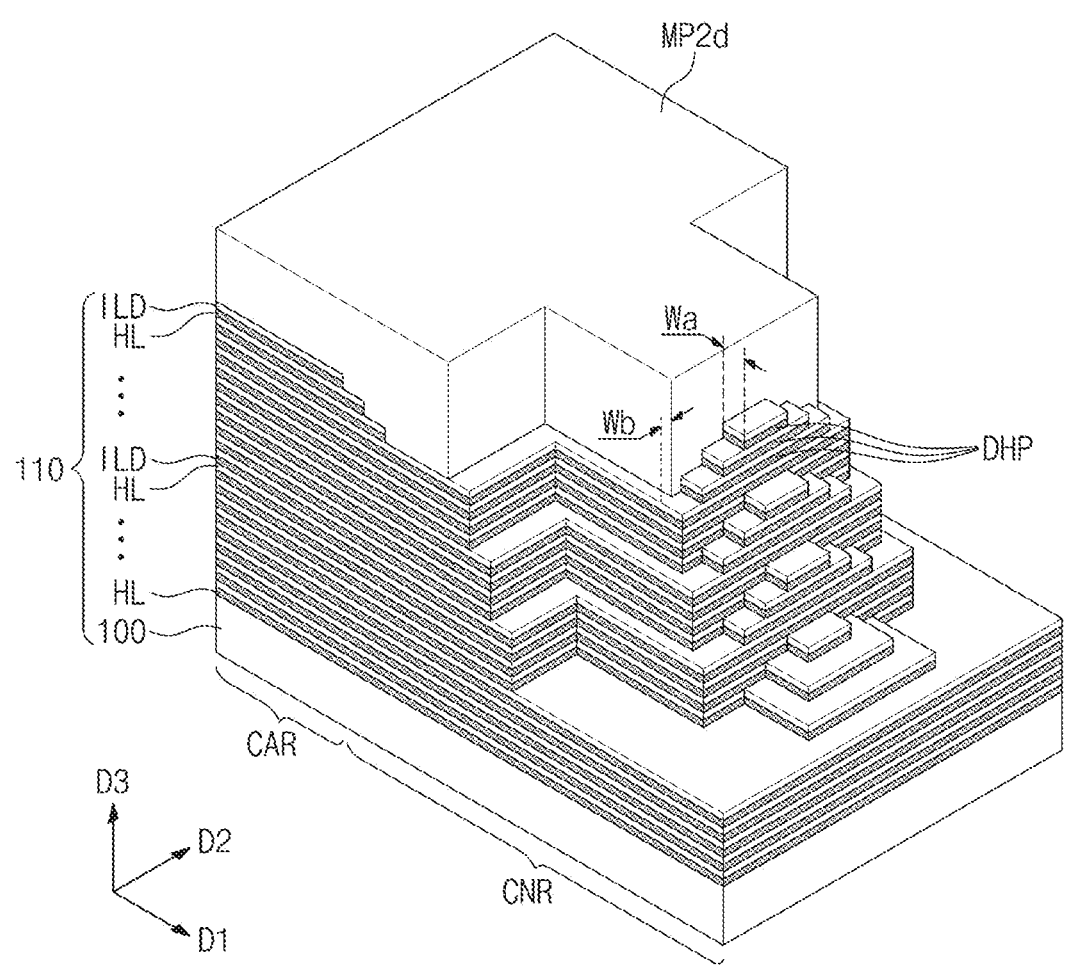

A second etching process may be performed in which the second-trimmed second mask pattern MP2c is used as an etching mask to etch the horizontal layers HL and portions of the dummy horizontal patterns DHP. FIG. 17E shows that four horizontal layers HL are sequentially etched by the second etching process that uses the second-trimmed second mask pattern MP2c. A second trimming process may be performed on the second-trimmed second mask pattern MP2c to form a third-trimmed second mask pattern MP2d, and a second etching process may be performed in which the third-trimmed second mask pattern MP2d is used. The second trimming processes and the second etching processes may be alternately performed to etch the horizontal semiconductor layer 100 on the connection region CNR.

According to some example embodiments of the present inventive concepts, because an electrode structure has a smaller width on a connection region than on a cell array region, an increased space (e.g., a wider space) may be provided between a plurality of electrode structures on the connection region. In such cases, conductive lines of interconnection structures may be connected in three directions to the electrode structure. As a result, the conductive lines connected to the electrode structure may have an increased degree of wiring freedom, and an integration density of three-dimensional semiconductor memory devices may increase.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. A three-dimensional semiconductor memory device, comprising:
a semiconductor layer comprising a cell array region and a connection region; and
a plurality of electrode structures on a surface of the semiconductor layer, wherein the plurality of electrode structures each extend in a first direction and are spaced apart from each other in a second direction intersecting the first direction, and both the first direction and the second direction are parallel to the surface of the semiconductor layer, and
wherein the plurality of electrode structures comprises:
a first electrode structure comprising a first electrode portion having a first width in the second direction on the cell array region and a first pad portion having a second width in the second direction on the connection region, the second width being less than the first width; and
a second electrode structure comprising a second electrode portion having the first width in the second direction on the cell array region and a second pad portion having the second width in the second direction on the connection region,
wherein the first electrode structure and the second electrode structure are directly adjacent each other,
wherein the first electrode portion and the second electrode portion are spaced apart from each other by a first distance,
wherein the first pad portion and the second pad portion are spaced apart from each other by a second distance that is greater than the first distance, and
wherein each of the first and second pad portions comprises a stair-step structure that extends along the first direction.

2. The three-dimensional semiconductor memory device of claim 1, further comprising a first interconnection structure between the first and second pad portions,
wherein the first electrode structure further comprises a plurality of electrodes stacked in a third direction that is perpendicular to the surface of the semiconductor layer,
wherein the first interconnection structure comprises:
a plurality of first contact plugs that are connected to first ones of the plurality of the electrodes, respectively; and
a plurality of first conductive lines that each extend in the second direction and are connected to the plurality of first contact plugs, respectively.

3. The three-dimensional semiconductor memory device of claim 2, further comprising a second interconnection structure,
wherein the second interconnection structure comprise:
a plurality of second contact plugs that are connected to second ones of the plurality of electrodes, respectively, and
a plurality of second conductive lines that each extend in the first direction and are connected to the plurality of second contact plugs, respectively.

4. The three-dimensional semiconductor memory device of claim 3, further comprising a peripheral circuit structure,
wherein the semiconductor layer extends between the plurality of electrode structures and the peripheral circuit structure,
wherein the first interconnection structure further comprises a plurality of first through plugs that connect first portions of the peripheral circuit structure to the plurality of first conductive lines, respectively, and
wherein the second interconnection structure further comprises a plurality of second through plugs that connect second portions of the peripheral circuit structure to the plurality of second conductive lines, respectively.

5. The three-dimensional semiconductor memory device of claim 4, wherein the first portions and the second portions of the peripheral circuit structure comprise a plurality of transistors that are connected to the plurality of first through plugs and the plurality of second through plugs, respectively.

6. The three-dimensional semiconductor memory device of claim 1, wherein the first electrode structure further comprises a plurality of electrodes stacked in a third direction that is perpendicular to the surface of the semiconductor layer,
wherein the plurality of electrodes comprise a lowermost electrode that is closest to the semiconductor layer in the third direction and has the second width on the connection region, and
wherein the plurality of electrodes further comprise an upper electrode, the lowermost electrode is between the upper electrode and the semiconductor layer, and the upper electrode has a third width that is less than the second width.

7. The three-dimensional semiconductor memory device of claim 1,
wherein the stair-step structure comprises a first stair-step structure that extends along the first direction, and
wherein each of the first and second pad portions further comprises a second stair-step structure that extends along the second direction.

8. The three-dimensional semiconductor memory device of claim 1, further comprising an interconnection structure between the first and second pad portions,
wherein the first electrode structure further comprises a plurality of first electrodes stacked in a third direction that is perpendicular to the surface of the semiconductor layer, and the second electrode structure further comprises a plurality of second electrodes stacked in the third direction, and
wherein the interconnection structure comprises:
a plurality of first conductive lines that are connected to the plurality of first electrodes, respectively; and
a plurality of second conductive lines that are connected to the plurality of second electrodes, respectively,
wherein each of the plurality of first conductive lines and the plurality of second conductive lines has a linear shape that extends in the second direction.

9. The three-dimensional semiconductor memory device of claim 1, wherein the first electrode structure further comprises a plurality of gate dielectric regions that extend through the first electrode portion on the cell array region and extend in the first direction.

10. The three-dimensional semiconductor memory device of claim 1, wherein the first electrode structure further comprises a plurality of electrodes stacked in a third direction that is perpendicular to the surface of the semiconductor layer, and the plurality of electrodes comprises a first electrode and a second electrode directly adjacent each other in the third direction,
wherein each of the first electrode and the second electrode has the second width in the second direction on the connection region.

11. A three-dimensional semiconductor memory device, comprising:
a horizontal semiconductor layer comprising a cell array region and a connection region;
an electrode structure that comprises a plurality of electrodes vertically stacked on a surface of the horizontal semiconductor layer and has a stair-step structure on the connection region, wherein the electrode structure comprises a first side surface and a second side surface that each extend in a first direction and are spaced apart from each other in a second direction intersecting the first direction, and the electrode structure further comprises a third side surface that connects the first and second side surfaces to each other;
a first interconnection structure that is adjacent to the first side surface of the electrode structure on the connection region, the first interconnection structure comprising a plurality of first conductive lines that each extend in the second direction;
a second interconnection structure that is adjacent to the second side surface of the electrode structure on the connection region, the second interconnection structure comprising a plurality of second conductive lines that are spaced apart from the plurality of first conductive lines and each extend in the second direction; and
a third interconnection structure that is adjacent to the third side surface of the electrode structure, the third interconnection structure comprising a plurality of third conductive lines that each extend in the first direction.

12. The three-dimensional semiconductor memory device of claim 11, wherein the electrode structure extends in the first direction from the cell array region onto the connection region, and
wherein the electrode structure has a first width in the second direction on the cell array region, a second width in the second direction on the connection region, and the second width is less than the first width.

13. The three-dimensional semiconductor memory device of claim 11, wherein the electrode structure comprises a pad portion on the connection region, and the pad portion comprises a first portion and a second portion that is between the connection region and the first portion, and
wherein the first portion of the pad portion has a first width in the second direction, the second portion of the pad portion has a second width in the second direction, and the second width is greater than the first width.

14. The three-dimensional semiconductor memory device of claim 11, further comprising a peripheral circuit structure comprising a plurality of peripheral circuits,
wherein the horizontal semiconductor layer extends between the electrode structure and the peripheral circuit structure,
wherein the first interconnection structure further comprises:
a plurality of first contact plugs that connect the plurality of first conductive lines to first ones of the plurality of electrodes, respectively; and
a plurality of first through plugs that are adjacent to the first side surface of the electrode structure on the connection region and connect the plurality of first conductive lines to first ones of the plurality of peripheral circuits, respectively,
wherein the second interconnection structure further comprises:
a plurality of second contact plugs that connect the plurality of second conductive lines to second ones of the plurality of electrodes, respectively; and
a plurality of second through plugs that are adjacent to the second side surface of the electrode structure on the connection region and connect the plurality of second conductive lines to second ones of the plurality of peripheral circuits, respectively, and
wherein the third interconnection structure further comprises:

a plurality of third contact plugs that connect the plurality of third conductive lines to third ones of the plurality of electrodes, respectively; and a plurality of third through plugs that are adjacent to the third side surface of the electrode structure on the connection region and connect the third conductive lines to third ones of the plurality of peripheral circuits, respectively.

15. The three-dimensional semiconductor memory device of claim 11, wherein the stair-step structure of the electrode structure comprises:
    a first stair-step structure that extends along the first direction; and
    a second stair-step structure that extends along the second direction.

16. The three-dimensional semiconductor memory device of claim 11, wherein the electrode structure comprises a plurality of gate dielectric regions that vertically extend through the electrode structure on the cell array region and extend in the first direction.

17. A three-dimensional semiconductor memory device, comprising:
    a horizontal semiconductor layer that comprises a cell array region and a connection region;
    an electrode structure that comprises a plurality of electrodes vertically stacked on the horizontal semiconductor layer, wherein the electrode structure extends in a first direction and comprises a stair-step structure on the connection region; and
    an interconnection structure on the connection region, wherein the interconnection structure comprises:
    a plurality of first contact plugs that are connected to first ones of the plurality of electrodes, respectively;
    a plurality of first conductive lines that extend in the first direction and are connected to the plurality of first contact plugs, respectively;
    a plurality of second contact plugs that are connected to second ones of the plurality of electrodes, respectively; and
    a plurality of second conductive lines that extend in a second direction intersecting the first direction and are connected to the plurality of second contact plugs, respectively.

18. The three-dimensional semiconductor memory device of claim 17, wherein the electrode structure comprises:
    an electrode portion that has a first width in the second direction on the cell array region; and
    a pad portion that has a second width in the second direction on the connection region, the second width being less than the first width.

19. The three-dimensional semiconductor memory device of claim 17, further comprising a peripheral circuit structure comprising a plurality of peripheral circuits,
    wherein the horizontal semiconductor layer extends between the electrode structure and the peripheral circuit structure,
    wherein the interconnection structure further comprises:
    a plurality of first through plugs that connect the plurality of first conductive lines to first ones of the plurality of peripheral circuits, respectively; and
    a plurality of second through plugs that connect the plurality of second conductive lines to second ones of the plurality of peripheral circuits, respectively.

20. The three-dimensional semiconductor memory device of claim 19, wherein the electrode structure comprises a first side surface extending in the first direction and a second side surface extending in the second direction,
    wherein the plurality of first through plugs are adjacent to the second side surface of the electrode structure, and the plurality of second through plugs are adjacent to the first side surface of the electrode structure.

* * * * *